United States Patent
Losee et al.

(10) Patent No.: US 10,566,324 B2
(45) Date of Patent: Feb. 18, 2020

(54) INTEGRATED GATE RESISTORS FOR SEMICONDUCTOR POWER CONVERSION DEVICES

(71) Applicant: General Electric Company, Schenectady, NY (US)

(72) Inventors: Peter Almern Losee, Clifton Park, NY (US); Alexander Viktorovich Bolotnikov, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 63 days.

(21) Appl. No.: 15/599,119

(22) Filed: May 18, 2017

(65) Prior Publication Data

US 2018/0337171 A1 Nov. 22, 2018

(51) Int. Cl.
*H01L 27/06* (2006.01)
*H01L 29/06* (2006.01)
(Continued)

(52) U.S. Cl.
CPC ........ *H01L 27/0629* (2013.01); *H01L 23/647* (2013.01); *H01L 29/0696* (2013.01); *H01L 29/1608* (2013.01); *H01L 21/8213* (2013.01)

(58) Field of Classification Search
CPC .......... H01L 27/0629; H01L 29/42372; H01L 21/76877; H01L 21/76802; H01L 21/046; H01L 21/32133; H01L 21/8213; H01L 21/823475; H01L 21/823437; H01L 29/1608; H01L 23/647; H01L 21/76895
See application file for complete search history.

(56) References Cited

U.S. PATENT DOCUMENTS

| 4,920,388 A | 4/1990 | Blanchard et al. |
| 5,366,932 A | 11/1994 | Temple |

(Continued)

FOREIGN PATENT DOCUMENTS

WO 2017/029748 A1 2/2017

OTHER PUBLICATIONS

International Search Report and Written Opinion issued in connection with corresponding PCT Application No. PCT/US2018/32614 dated Oct. 23, 2018.

(Continued)

*Primary Examiner* — Bilkis Jahan
*Assistant Examiner* — Victor V Barzykin
(74) *Attorney, Agent, or Firm* — Fletcher Yoder, P.C.

(57) ABSTRACT

A semiconductor power conversion device includes a plurality of device cells in different portions of the active area, each including a respective gate electrode. The device includes a gate pad having a plurality of integrated resistors, each having a respective resistance. The device includes a first gate bus extending between the gate pad and the plurality of gate electrodes in a first portion of the active area. The plurality of gate electrodes in the first area is electrically connected to an external gate connection via a first integrated resistor and the first gate bus, and wherein the plurality of gate electrodes in a second portion of the active area is electrically connected to the external gate connection via a second integrated resistor, wherein the first and second integrated resistors have substantially different respective resistance values.

29 Claims, 15 Drawing Sheets

(51) Int. Cl.
    *H01L 29/16*     (2006.01)
    *H01L 23/64*     (2006.01)
    *H01L 21/82*     (2006.01)

(56) References Cited

U.S. PATENT DOCUMENTS

| | | |
|---|---|---|
| 5,592,006 A | 1/1997 | Merrill |
| 8,314,462 B2 | 11/2012 | Hull et al. |
| 8,324,686 B2 | 12/2012 | Willmeroth et al. |
| 8,614,480 B2 | 12/2013 | Wang et al. |
| 9,041,120 B2 | 5/2015 | Voss et al. |
| 2002/0140024 A1 | 10/2002 | Aoki et al. |
| 2006/0220121 A1 | 10/2006 | Frisina et al. |
| 2009/0128223 A1 | 5/2009 | Lui et al. |
| 2009/0218620 A1 | 9/2009 | Hebert et al. |
| 2010/0181627 A1* | 7/2010 | Willmeroth ............ H01L 24/03 257/379 |

OTHER PUBLICATIONS

Wang et al., "A double-end sourced multi-chip improved wire-bonded SiC MOSFET power module design", 2016 IEEE Applied Power Electronics Conference and Exposition (APEC), pp. 709-714, Mar. 20-24, 2016, Long Beach, CA.

Ji Hu et al., "Robustness and Balancing of Parallel-Connected Power Devices: SiC Versus CoolMOS", IEEE Transactions on Industrial Electronics, vol. 63, Issue: 4, pp. 2092-2102, Apr. 2016.

* cited by examiner

INTEGRATED GATE RESISTORS FOR SEMICONDUCTOR POWER CONVERSION DEVICES

BACKGROUND

The subject matter disclosed herein relates generally to semiconductor power conversion devices and, more specifically, to silicon carbide (SiC) power conversion devices.

Power conversion systems are widely used throughout modern electrical systems to convert electrical power from one form to another for consumption by a load. Many power electronics systems utilize various semiconductor devices and components, such as thyristors, diodes, and various types of transistors (e.g., metal-oxide-semiconductor field-effect transistor (MOSFETs), insulated gate bipolar transistors (IGBTs), and other suitable transistors), in this power conversion process. Larger power conversion system can include numerous power conversion devices (e.g., arranged into power modules) that cooperate to convert electrical power.

Certain semiconductor power conversion devices include a plurality of device cells (e.g., MOSFET device cells), and include a gate pad that is electrically connected to the gate electrode of each cell. However, in a typical power conversion device, when a suitable voltage is applied to the gate pad, device cells that are closer in proximity to the gate pad may respond (e.g., activate or deactivate) faster than device cells that are disposed farther from the gate pad. This difference in propagation delay can result in undesirable non-uniformities or localization in the current/voltage distribution of the power conversion device. While these undesirable non-uniformities can be circumvented using external resistors (e.g., standalone, surface-mounted chip resistors inserted between the gate terminal and gate driver), such external resistors add additional cost and complexity to the power module and system, consume precious limited space within the device packaging, and compromise the dynamic performance of device as a trade-off.

BRIEF DESCRIPTION

In an embodiment, a semiconductor power conversion device includes an active area having a plurality of device cells disposed in different portions of the active area, wherein each of the plurality of device cells includes a respective gate electrode. The device includes a gate pad and bus area having a gate pad, a first gate bus, and a gate pad metal. The gate pad includes a gate metal contact region disposed adjacent to a plurality of integrated resistors that each have a respective resistance. The first gate bus extends between the gate pad and a first portion of the plurality of gate electrodes in a first portion of the active area of the device. The gate pad metal is disposed directly over the gate metal contact region of the gate pad and bonded to an external gate connection. The first portion of the plurality of gate electrodes is electrically connected to the external gate connection via a first integrated resistor of the plurality of integrated resistors, the first gate bus, the gate metal contact region, and the gate pad metal, and a second portion of the plurality of gate electrodes in a second portion of the active area of the device is electrically connected to the external gate connection via a second integrated resistor of the plurality of integrated resistors, the gate metal contact region, and the gate pad metal. Additionally, the first and second integrated resistors have substantially different respective resistance values.

In another embodiment, a method includes forming a plurality of gate electrodes of a plurality of device cells in an active area of a semiconductor power conversion device. The method further includes forming a gate pad in a gate pad and bus area of the semiconductor power conversion device, wherein the gate pad comprises a gate metal contact region disposed adjacent to a plurality of integrated resistors, each having a respective resistance, and wherein each of the plurality of gate electrodes are electrically connected to the gate metal contact region of the gate pad by at least one of the plurality of integrated resistors.

In another embodiment, a semiconductor power conversion device includes an active area including a plurality of device cells disposed in different portions of the active area, wherein each of the plurality of device cells includes a respective gate electrode. The device includes a gate pad and bus area having a gate pad including a gate metal contact region disposed adjacent to an integrated resistor network and a first gate bus extending between the gate pad and a first portion of the plurality of gate electrodes in a first portion of the active area of the device. The first portion of the plurality of gate electrodes is electrically connected to the gate metal contact region via a first portion of the integrated resistor network and the first gate bus, and a second portion of the plurality of gate electrodes in a second portion of the active area of the device is electrically connected to the gate metal contact region via a second portion of the integrated resistor network. Additionally, a resistance value the first portion of the integrated resistor network is substantially different from a resistance value the second portion of the integrated resistor network.

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
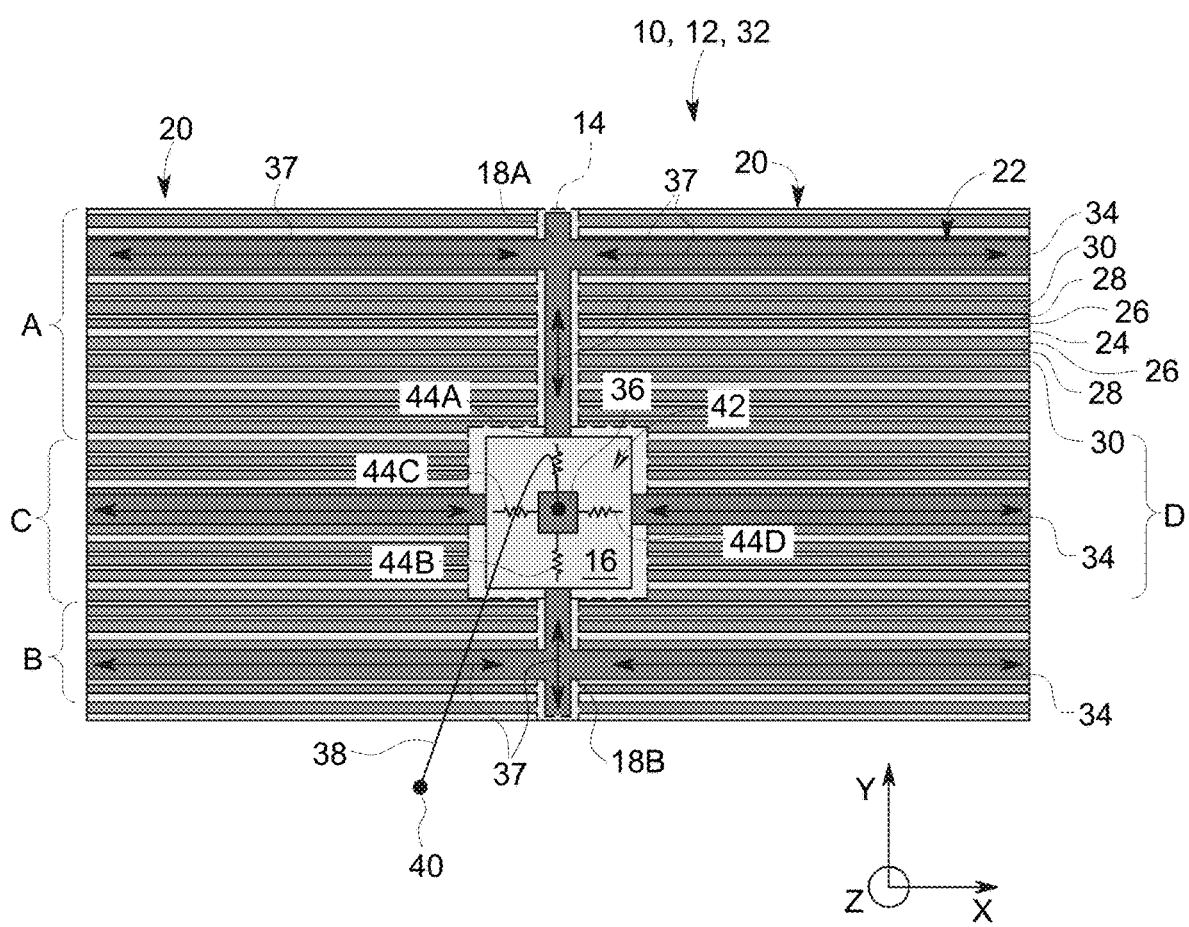
FIG. 1 is a top-down view of a portion of a power conversion device including an active area having a number of MOSFET device cells, and including a gate pad and bus area having a gate pad with an integrated resistor network electrically connected to gate electrodes of the device cells in the active area, in accordance with embodiments of the present approach.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also when introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. If ranges are disclosed, the endpoints of all ranges directed to the same component or property are inclusive and independently combinable. The modifier "approximately" used in connection with a quantity is inclusive of the stated value and has the meaning dictated by the context (e.g., includes the degree of process variations or errors associated with measurement of the particular quantity).

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness unless otherwise specified. Furthermore, the term "a layer" as used herein refers to a single layer or a plurality of layers, unless the context clearly dictates otherwise. Further, as used herein, the phrase "disposed on," refers to layers disposed directly in contact with each other or indirectly by having intervening layers there between, unless otherwise specifically indicated. The terms "adjacent," "directly on," "directly over," "directly under," as used herein refers to two layers or features that are disposed contiguously and are in direct contact with each other. In contrast, the terms "on," "above," "below," describe the relative position of the layers/regions to each other and does not necessarily require that two layers or features be disposed contiguously or be in direct contact with each other. As used herein, the terms "top" or "upper" refer to the particular feature that is relatively the farthest from the substrate layer.

As set forth above, in a typical semiconductor power conversion device, when a suitable voltage pulse is applied to a gate pad, device cells that are closer in proximity to (e.g., have a shorter electrical pathway to) the gate pad may respond (e.g., activate or deactivate, conduct current or block current flow, turn-on or turn-off) faster than device cells that are disposed farther from the gate pad, and the resulting difference in propagation delays can create undesirable localization in the current/voltage distribution of the power conversion device. To illustrate this point, FIG. 1 illustrates a top-down view of a portion of an embodiment of a power conversion device 12 (e.g., a SiC power conversion device having a SiC epitaxial semiconductor layer 10). The device 12 includes a gate pad and bus area 14 (indicated by the dashed outline) having a gate pad 16 and a gate buses 18 (e.g., gate bus 18A and 18B). The illustrated device 12 further includes an active area 20, which is the area outside of the dashed outline of the gate pad and bus area 14. The illustrated active area 20 includes a number of device cells 22 (e.g., striped MOSFET device cells 22) disposed on opposite sides of the gate pad and bus area 14. It should be appreciated that, while the present technique is discussed herein in the context of the illustrated striped MOSFET device cells 22, the present techniques may be applicable to other types of semiconductor device structures, such as diodes, thyristors, transistors (e.g., insulated gate bipolar transistor (IGBT), junction field-effect transistor (JFET), metal-semiconductor field-effect transistor (MESFET), etc.), or any other suitable device utilizing a gate electrode using any type of active cell geometry (e.g., square, stripe, hexagonal, etc.). Those skilled in the art will appreciate that, for illustrative purposes, FIG. 1 omits certain features of the device 12 (e.g., certain gate electrodes, gate dielectrics, interlayer dielectrics, source metal, terminations, packaging) included in actual implementations of the presently disclosed technique, some of which are discussed in greater detail below.

The illustrated striped MOSFET device cells 22 of FIG. 1 include body/source contact regions 24 (e.g., common contact), source regions 26, channel regions 28, and junction field-effect transistor (JFET) regions 30 that disposed adjacent to the surface 32 of semiconductor layer 10. Further, while only a portion of the MOSFET cells 22 in FIG. 1 are illustrated as including gate electrodes 34 to allow a better view of the semiconductor layer 10, in an actual implementation of the power conversion device 12, all of the device cells 22 would generally include a respective gate electrode 34 disposed at least partially above substantially all of the source regions 26, channel regions 28, and junction field-effect transistor (JFET) regions 30 at the surface 32 of the semiconductor layer 10. It may be noted that cross-sectional views of an example power conversion device 12 are discussed below, with respect to FIGS. 8A and 8B, and provide additional details regarding the structure of these device cells 22.

As illustrated in FIG. 1, the gate pad 16 includes a gate metal contact region 36. A gate pad metal (not illustrated in FIG. 1) is disposed directly over the gate metal contact region 36 and is wire bonded (e.g., via wire bond 38) to an external gate connection 40 via or through the gate pad 16 and gate buses 18, the external gate connection 40 provides suitable gate biases to operate the gate electrodes 34 of power conversion device 12. Therefore, when a suitable gate voltage pulse is applied to the gate metal contact region 36 by the external gate connection 40, transient current generally flows through the gate pad 16, the gate bus 18, and along the gate electrodes 34 of the device cells 22, as indicated by the arrows 37. More specifically, gate electrodes 34 of MOSFET device cells 22 in area A are electrically connected to the gate pad 16 through or via gate bus 18A, gate electrodes 34 of MOSFET device cells 22 in area B are electrically connected to the gate pad 16 through or via gate bus 18B, while gate electrodes 34 of MOSFET device cells 22 in areas C and D are physically and electrically connected directly to the gate pad 16. As such, it is presently recognized that, when the resistance of the gate pad 16 is substantially uniform, as it is for typical devices 12, when a suitable gate voltage pulse is applied to the gate metal contact region 36 via the external source 40, MOSFET cells 22 in different areas (e.g., areas A, B, C, and D) can have different turn off and on delay times due finite resistance of the gate material, creating the aforementioned performance issues.

With this in mind, present embodiments are directed toward semiconductor power conversion devices 12, as illustrated in FIG. 1, having a resistor network 42 (e.g., including integrated resistors 44A, 44B, 44C, and 44D) integrated into the gate pad 16 of the power conversion device 12. More specifically, as illustrated, gate electrodes 34 of MOSFET cells 22 in area A are electrically connected to the gate metal contact region 36 via the integrated resistor 44A, gate electrodes 34 of MOSFET cells 22 in area B are electrically connected to the gate metal contact region 36 via the integrated resistor 44B, gate electrodes 34 of MOSFET cells 22 in area C are electrically connected to the gate metal contact region 36 via the integrated resistor 44C, and gate electrodes 34 of MOSFET cells 22 in area D are electrically connected to the gate metal contact region 36 via the integrated resistor 44D of the integrated resistor network 42. As discussed below, the disclosed gate pad 16, including the integrated resistor network 42, is fabricated during the same processing step as other features of the device 12 (e.g., gate electrodes 34, gate buses 18), and, as such, the present design does not require extra processing steps to implement. Additionally, as discussed below, in certain embodiments, the integrated resistor network 42 can enable the disclosed gate pad 16 to have a unique asymmetric structure that counterbalances internal asymmetry of dynamic characteristics (e.g. asymmetric turn-on/off of capacitive load or input capacitance) in the power conversion device 12 to provide uniform current/voltage distribution in all device cells during switching events.

Figure 2:
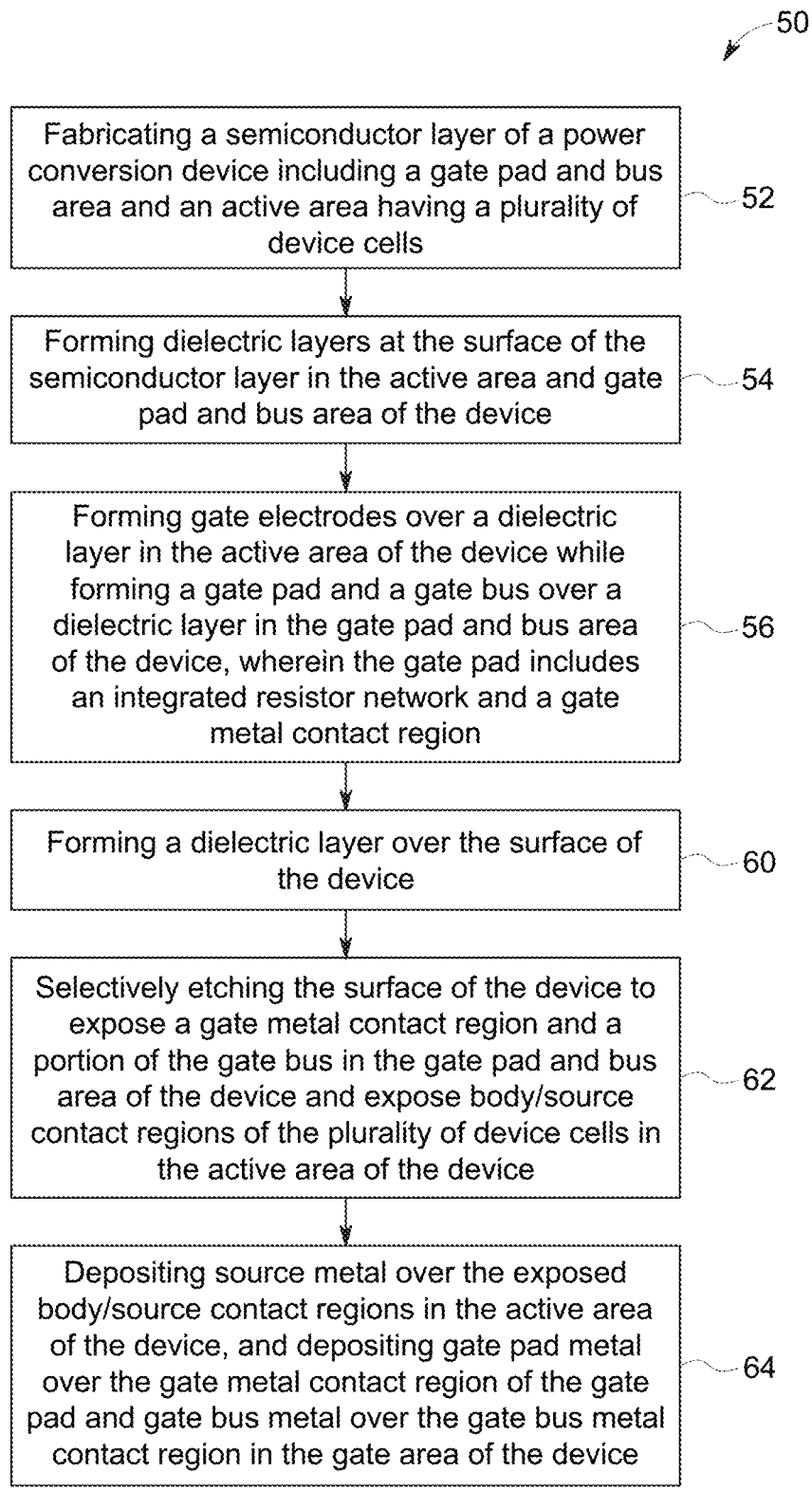
FIG. 2 is a flow diagram of a portion of a process for fabricating the power conversion device of FIG. 1, which includes the gate pad having the integrated resistor network, in accordance with embodiments of the present technique.
Figure 3:
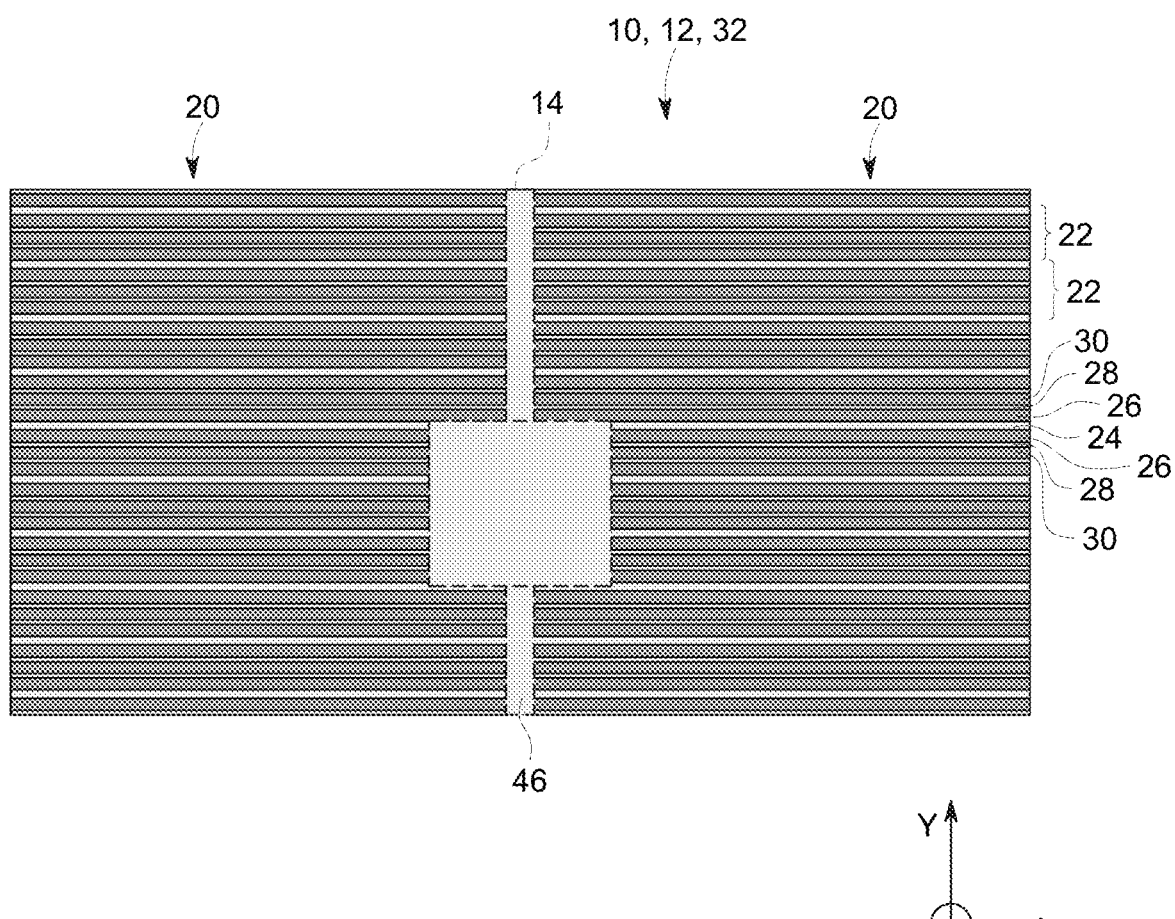
FIG. 3 is a top-down view of the surface of the power conversion device at the beginning of the fabrication process of FIG. 2, in accordance with embodiments of the present approach.

With the foregoing in mind, FIG. 2 is a flow diagram illustrating an embodiment of a portion or subset of a process 50 for fabricating a power conversion device 12 having integrated resistor network 42 disposed within (integrated into) the gate pad 16, as illustrated in FIG. 1, in accordance with embodiments of the present technique. Further, FIGS. 3-7 are referred to throughout the description of the illustrated process 50, to provide top-down, surface views of an example semiconductor power conversion device 12 at different stages of fabrication. The illustrated process 50 begins with fabricating (block 52) a semiconductor layer 10 of the semiconductor power conversion device 12. For example, FIG. 3 illustrates a surface 32 of a semiconductor layer 10 (e.g., a SiC epitaxial layer) of an embodiment of a power conversion device 12. The active area 20 of the illustrated device 10 includes body/source contact regions 24, source regions 26, channel regions 28, and JFET regions 30 of a plurality of partially formed device cells 22, all disposed adjacent to the surface 32 of a semiconductor layer 10. As may be appreciated, these regions of the device cells 22 are generally formed and defined via successive masking and doping of the semiconductor layer 10. Furthermore, it may be noted that the JFET regions 30 and source regions 26 have a first conductivity-type (e.g., n-type or p-type), and the body/source contact regions 24 and the well/channel regions 28 have a second conductivity-type (e.g., n-type or p-type) that is opposite the first conductivity-type. Additionally, like the regions 24 and 28, the gate pad and bus area 14 includes an implanted region 46 of the second conductivity-type, as illustrated in FIG. 3.

Figure 4:
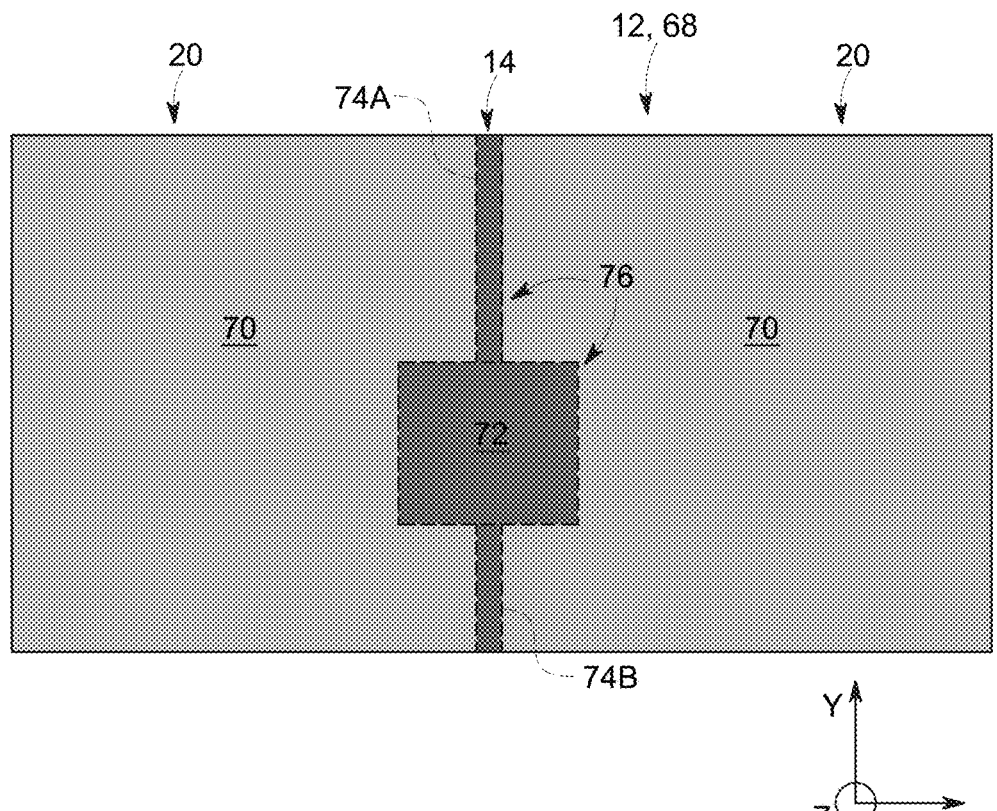
FIG. 4 is a top-down view of the surface of the power conversion device illustrated in FIG. 3, after deposition of dielectric layers over portions of the active area and gate pad and bus area of the device, in accordance with embodiments of the present approach.

The process 50 illustrated in FIG. 2 continues with forming (block 54) dielectric layers at (e.g., on or over) the surface 32 of the semiconductor layer 10. For example, FIG. 4 illustrates a top surface 68 of the power conversion device 12 of FIG. 3, in which the active area 20 is substantially covered with a gate dielectric layer 70. Additionally, the gate pad and bus area 14 of the device 12 includes a gate pad area 72 and a gate bus areas 74 (e.g., gate bus areas 74A and 74B) having a field oxide layer 76 that is substantially thicker (e.g., 5×-20× thicker along the Z-axis) than the gate dielectric layer 70. For example, the gate dielectric layer 70 and the field oxide layer 76 may be formed during separate oxide growth or deposition steps.

Figure 5:
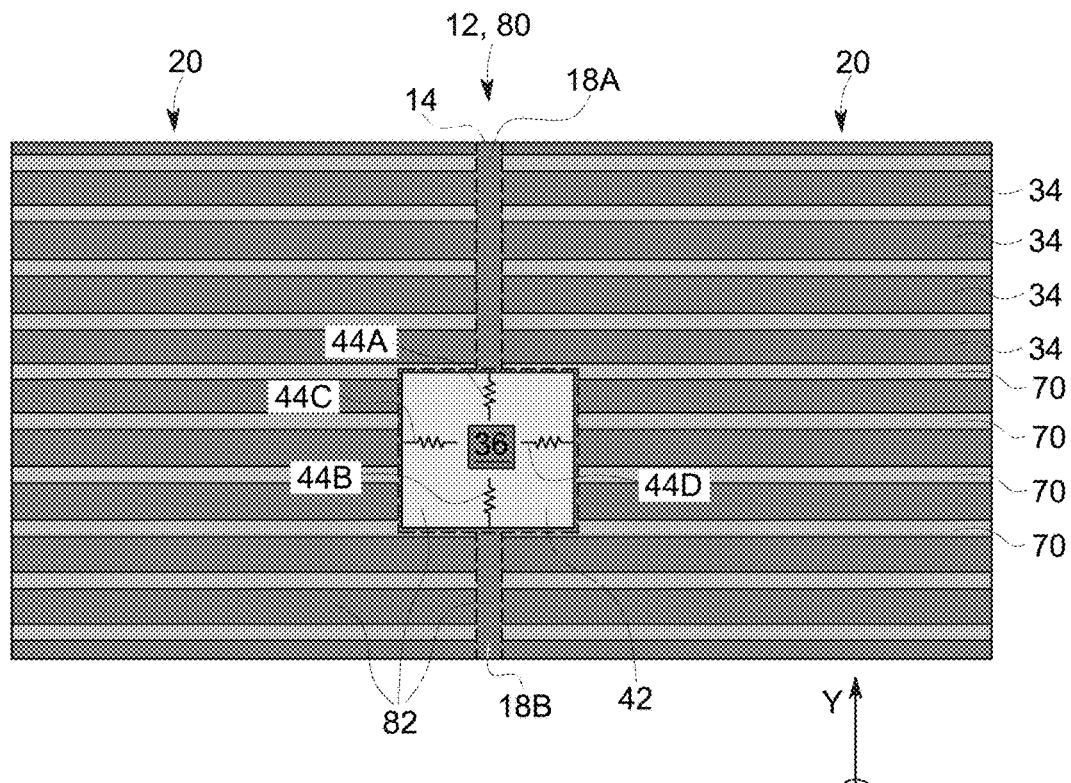
FIG. 5 is a top-down view of the surface of the power conversion device illustrated in FIG. 4, after forming the gate electrodes, gate buses, and gate pad of the device, in accordance with embodiments of the present approach.

Returning to FIG. 2, the illustrated process 50 continues with forming (block 56) gate electrodes 34 in the active area 20 of the power conversion device, and forming a gate pad 16 and a gate buses 18 in the gate pad and bus area of the device. FIG. 5 illustrates a surface 80 of the power conversion device 12 after forming gate electrodes 34, gate pad 16, and gate buses 18 (e.g., gate buses 18A and 18B). More specifically, the gate electrodes 34 are deposited directly on the gate dielectric layer 70 in the active area 20 of the device 12, and the gate pad 16 and gate buses 18 (e.g., gate bus 18A and 18B) are deposited directly over the field oxide layer 76 (as illustrated in FIG. 4) in portions of the gate pad and bus area 14 of the device 12.

For the embodiment illustrated in FIG. 5, the gate electrodes 34, the gate pad 16, and the gate buses 18 are made of a low-impedance gate materials 82, including, but not limited to metals (e.g., aluminum, molybdenum, nickel, tungsten), highly doped polysilicon, metal silicides (e.g., molybdenum silicide ($MoSi_2$), tantalum silicide ($TaSi_2$), tungsten silicide ($WSi_2$), cobalt silicide ($CoSi_2$), nickel silicide ($NiSi_2$), titanium silicide ($TiSi_2$)), and combinations thereof. For example, in certain embodiments, the gate electrodes 34, the gate pad 16, and the gate buses 18 are all made from the same gate material 82, which includes a polysilicon layer (e.g., n-doped polySi) disposed below a silicide layer (e.g., $TaSi_2$). In certain embodiments, the gate material 82 that forms the gate pad 16 may have a sheet resistance of between approximately 2 ohms per square (ohm/square) and approximately 50 ohm/square (e.g., between approximately 3 ohms/square and approximately 6 ohms/square) at 25° C. Further, in certain embodiments, the gate pad 16 and the gate electrodes 34 may have substantially the same sheet resistance. In certain embodiments, the gate material 82 first may be deposited over a substantial portion of the surface 68 of the device 12 illustrated in FIG. 4, and then may be selectively etched to form the gate electrodes 34, the gate pad 16 (including the integrated resistor network 42), and the gate buses 18 on the surface 80 of the device, as illustrated in FIG. 5.

Additionally, the gate pad 16 illustrated in FIG. 5 includes a gate metal contact region 36 and integrated resistor network 42, which includes integrated resistors 44A, 44B, 44C, 44D. The integrated resistor network 42 is electrically connected between the gate metal contact region 36 of the gate pad 16 and the gate electrodes 34 in the active area 20 of the power conversion device 12. While the structure of the integrated resistor network 42 is discussed in greater detail below, the integrated resistor network 42 is generally formed by modifying (e.g., patterning, etching) regions of the gate material 82 used to form the gate pad 16. For example, in certain embodiments, after deposition, portions of the gate material 82 may be selectively removed (e.g., patterned, etched) to form the integrated resistor network 42 adjacent to (e.g., around, surrounding) the gate metal contact region 36 of the gate pad 16. Accordingly, in certain embodiments, the disclosed integrated resistor network 42 may be designed and arranged in a power conversion device 12 to resolve the aforementioned imbalance of propagation delay issues without requiring additional fabrication steps and without the use of external chip resistors.

Figure 6:
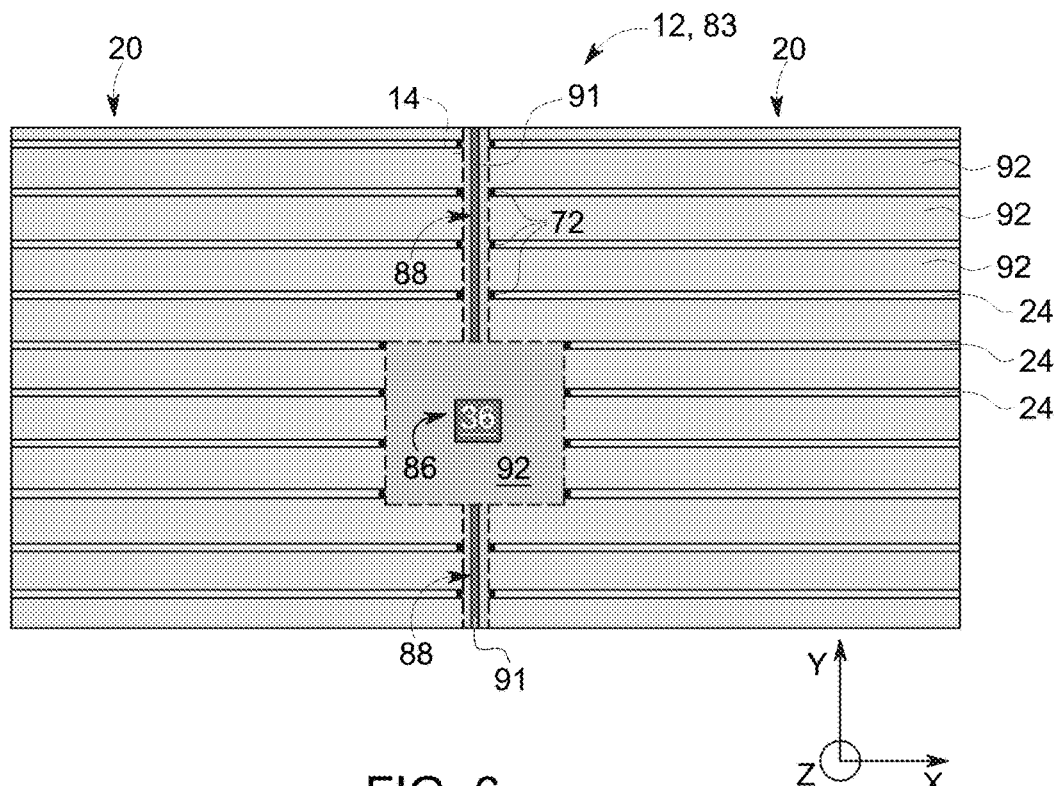
FIG. 6 is a top-down view of the surface of the power conversion device illustrated in FIG. 5, after forming a dielectric layer over the surface of the device, and then selectively etching the surface of the device to form gate and bus vias in the gate pad and bus area, as well as expose body/source contact regions of the plurality of device cells in the active area, in accordance with embodiments of the present approach.

Returning to FIG. 2, the illustrated process 50 continues with forming (block 60) a dielectric layer over a substantial portion of the surface of the power conversion device. In certain embodiments, the dielectric layer deposited in block 60 may be referred to as an interlayer dielectric layer (ILD). Subsequently, the surface of the power conversion device may be selectively etched (block 62) to expose gate metal contact regions 36 of the gate pad and gate bus metal contact regions 91 in the gate pad and bus area 14 of the device, and to expose the body/source contact regions 24 of the device cells in the active area of the device. For example, FIG. 6 illustrates an example of the surface 83 of the power conversion device 12 after performing the steps set forth in blocks 60 and 62. The surface 83 of the device 12, as illustrated in FIG. 6, includes an ILD 92 disposed over a substantial portion of the surface of the device 12 (e.g., the gate electrodes 34, the gate buses 18, and integrated resistor network 42). Further, in FIG. 6, portions of the dielectric (e.g., the gate dielectric layer 70) have been selectively removed to expose the body/source contact regions 24 of the device cells 22 in the active area 20 of the device 12 for later source metallization. Additionally, portions of the ILD 92 have been etched to form a gate via 86 that exposes the gate metal contact region 36 of the gate pad 16, and to form a bus vias 88 that expose gate bus metal contact regions 91 of the gate bus 18, in the gate pad and bus area 14 of the device 12 for later gate metallization.

Figure 7:
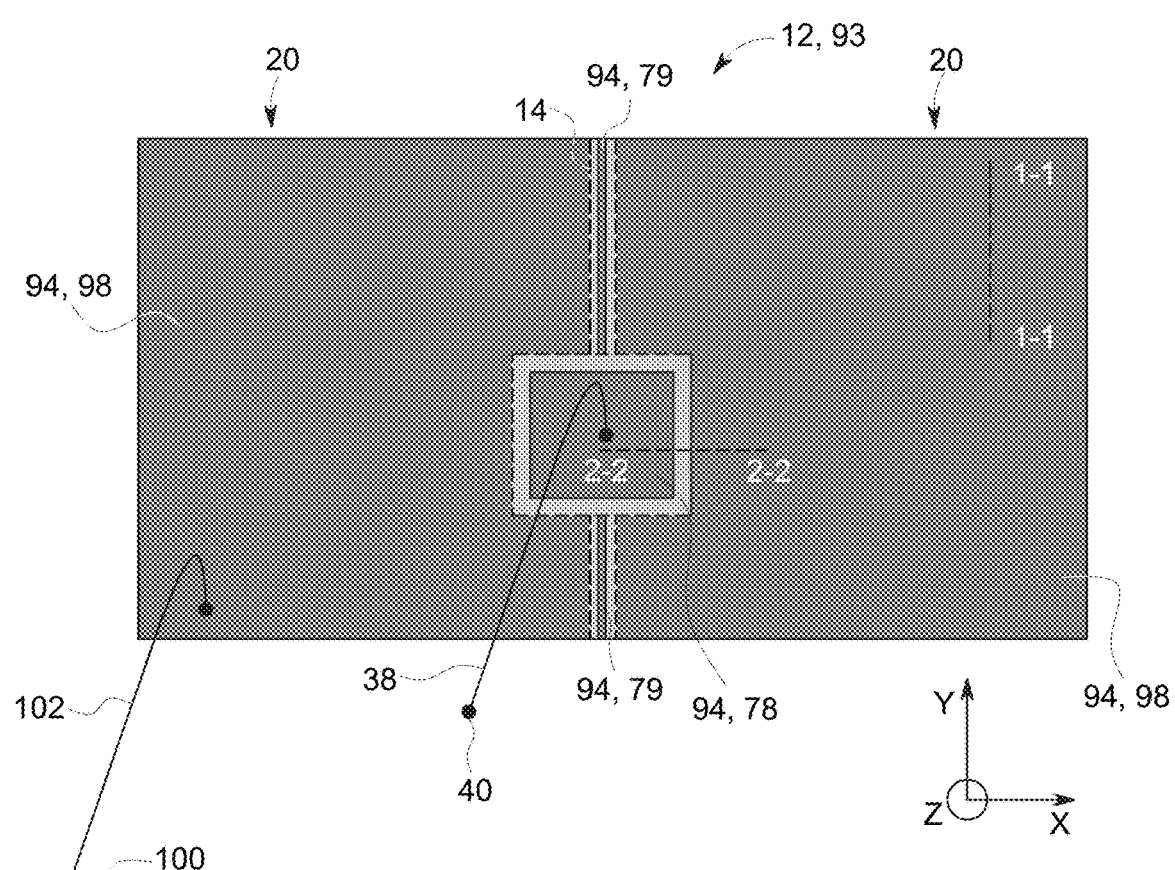
FIG. 7 is a top-down view of the surface of the power conversion device illustrated in FIG. 6, after depositing gate pad metal and gate bus metal in the gate pad and bus area of the device, and after depositing source metal in the active area of the device, in accordance with embodiments of the present approach.

Returning to FIG. 2, the illustrated process 50 concludes with depositing (block 64) source metal over the body/source contact regions 24 of the plurality of striped device cells 22 in the active area, and depositing gate pad metal 78 directly over the gate metal contact region 38 of the gate pad 16, as well as depositing gate bus metal 79 over the gate bus metal contact region 91, in the gate pad and bus area 14 of the of the power conversion device 12. For example, in certain embodiments, one or more metals (e.g., aluminum) may be deposited (e.g., evaporated, sputtered, deposited by chemical vapor deposition) over a substantial portion of the surface 83 of the device 12 illustrated in FIG. 6, such that the portions of the surface 83 of the device 12 exposed in block 62 are directly contacted by the deposited metal. Subsequently, as illustrated by the surface 93 of the device 12 in FIG. 7, the deposited metal layer 94 is selectively etched to form and electrically isolate gate pad metal 78 disposed in the gate pad and bus area 14 of the device 12 from source metal 98 disposed in the active area 20 of the device 12. Additionally, the deposited metal layer 94 is selectively etched to electrically isolate gate pad metal 78 disposed over the gate pad 16 from gate bus metal 79 disposed over the gate bus 18. It may be appreciated that the gate bus metal 79 reduces impedance of the gate bus 18 while being electrically connected to the gate metal contact region 36 through the integrated resistor network 42 of the gate pad 16, in accordance with present embodiments. As illustrated in FIG. 7, the gate pad metal 78 is electrically coupled to an external gate connection 40 via the wire bond 38, and the source metal 98 is electrically coupled to an external source connection 100 via the wire bond 102, to facilitate operation of the power conversion device 12.

Figure 8A:
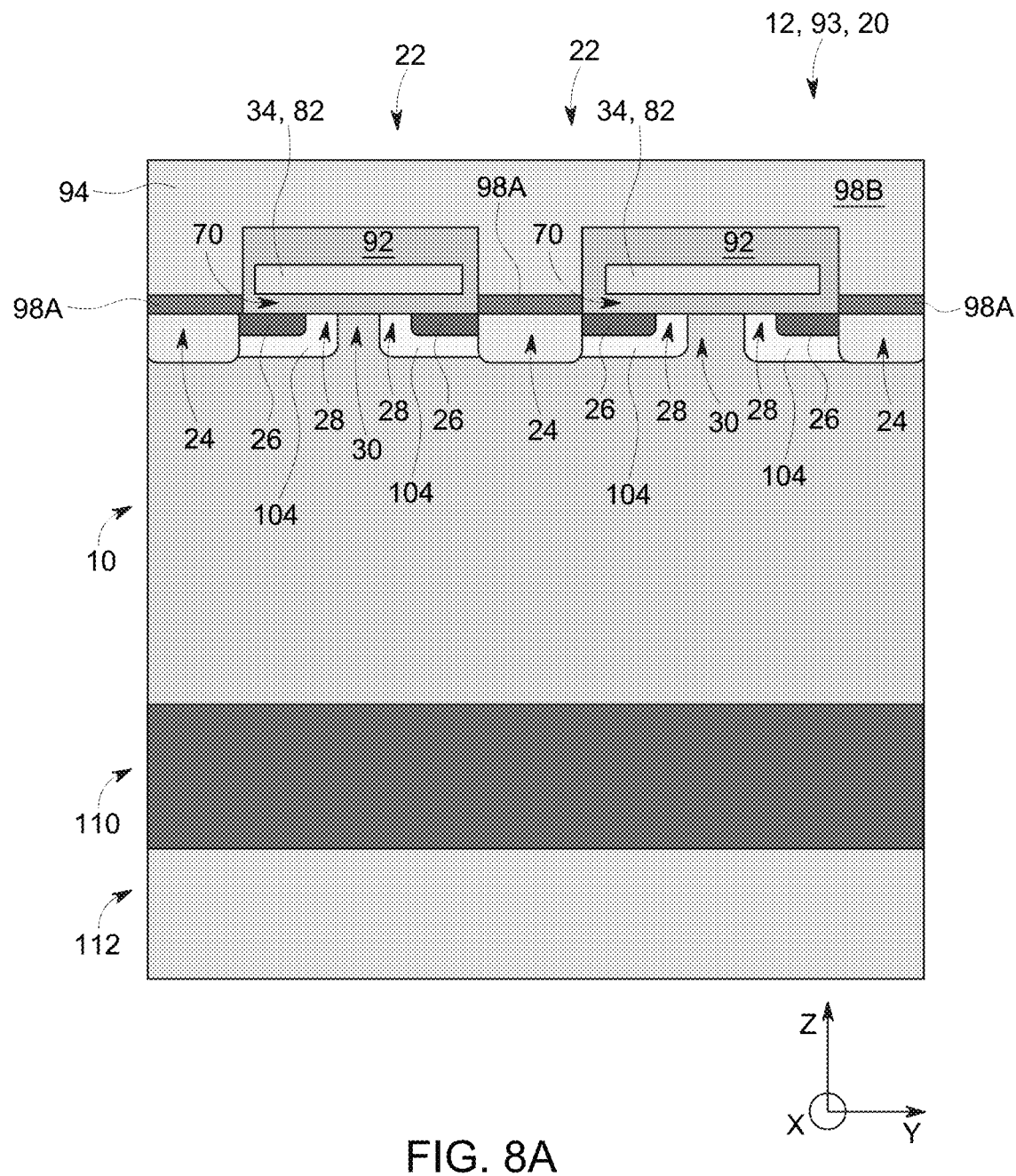
FIGS. 8A and 8B are cross-sectional views of the power conversion device illustrated in FIG. 7, taken along lines 1-1 and 2-2, respectively, in accordance with embodiments of the present approach.

FIG. 8A illustrates a cross-sectional view of the embodiment of the power conversion device 12, as illustrated in FIG. 7, taken along the line 1-1. More specifically, the cross-sectional view of the device 12 in FIG. 8A illustrates a plurality of device cells 22 including body/source contact regions 24, source regions 26, channel regions 28 (part of well regions 104), and JFET regions 30, as set forth above. Additionally, the illustrated device 12 includes gate electrodes 34 that are separated from portions of the source regions 26, channel regions 28, and JFET regions 30 by the gate dielectric layer 70, and separated from the source metal 98 by the ILD 92. The illustrated source metal 98 includes a first portion 98A (e.g., a contact portion 98A) that is directly over the body/source contact regions 24, and a second portion 98B disposed directly over the first portion 98A. FIG. 8A further illustrates that the semiconductor layer 10 is disposed above (e.g., directly on) a substrate layer 110. The illustrated device 12 also includes drain metal 112 deposited on a surface of the substrate layer 110, opposite the semiconductor layer 10. It should be noted that there exists a capacitance associated with the gate electrode 34 coupled to the source metal 98 through the ILD 92 and the underlying semiconductor regions through the gate dielectric 70, and this acts as a capacitive load that is charged and discharged during switching transients through the aforementioned equivalent resistance from the active cell to the external gate connection (40).

Figure 8B:
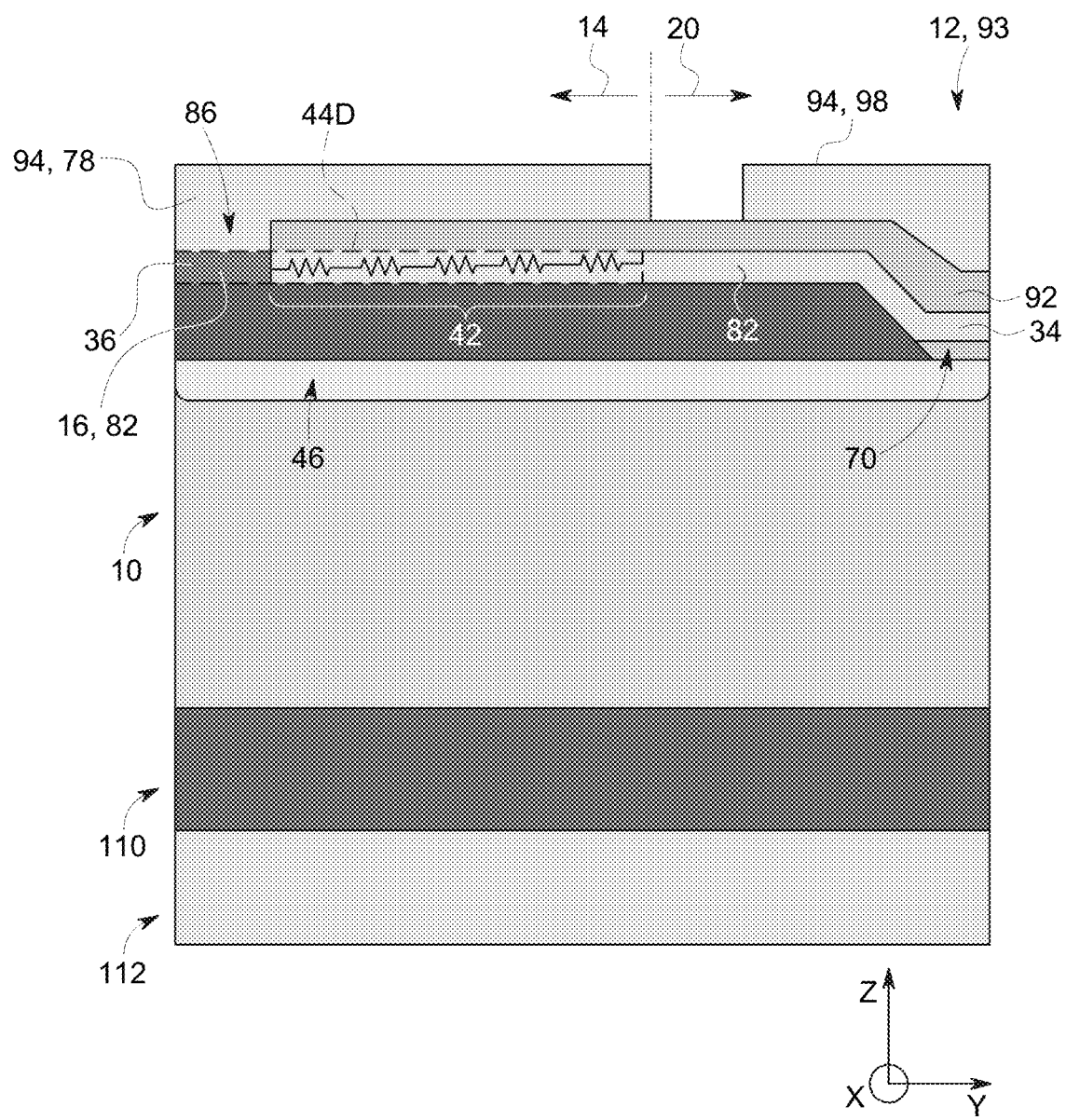

FIG. 8B illustrates another cross-sectional view of the embodiment of the power conversion device 12 of FIG. 7, instead taken along the line 2-2. More specifically, the cross-sectional view of FIG. 8B illustrates a portion of a boundary between the active area 20 and the gate pad and bus area 14 of the device. As such, FIG. 8B illustrates a gate electrode 34 of a device cell 22 (not shown) extending from the active area 20 and being electrically and physically connected to the integrated resistor network 42 of the gate pad 16, all formed from the gate material 82. More specifically, the gate electrode 34 of the device cell 22 is electrically connected to the gate metal contact region 36 via integrated resistor 44D of the integrated resistor network 42. Furthermore, FIG. 8B illustrates the gate pad metal 78 electrically and physically isolated from the integrated resistor network 42 of the gate pad 16 by the ILD 92. However, gate via 86 provides an opening in the ILD 92 that enables the gate pad metal 78 to directly contact the gate metal contact region 36 of the gate pad 16. As such, the transient gate current (or gate charge) flow path for the illustrated gate includes the gate pad metal 78, the gate metal contact region 36, the integrated resistor 44D and the remainder of the integrated resistor network 42, as well as the gate electrode 34. It may be noted that, in certain embodiments device 12, numerous (e.g., tens or hundreds) of MOSFET cells 22 may have gate electrodes 34 that are electrically connected directly to the gate pad 16, as illustrated in FIG. 8B.

FIGS. 9, 10, and 11 demonstrate the design and advantage of embodiments of gate pads 16 that include an integrated resistor network 42 having two or more integrated resistors 44 with at least two or more different respective resistance values, in accordance with embodiments of the present approach. Additionally, for the examples presented in FIGS. 9, 10, and 11, the gate pad 16 is electrically coupled to the gate electrodes 34 of device cells 22 in the indicated areas: B, C, and D. It may further be noted that the gate pad 16 is offset from the center of the device 12, such that area B is larger (includes a greater number of device cells) than area D, similar to the device 12 illustrated in FIG. 12, discussed below.

Figure 9A:
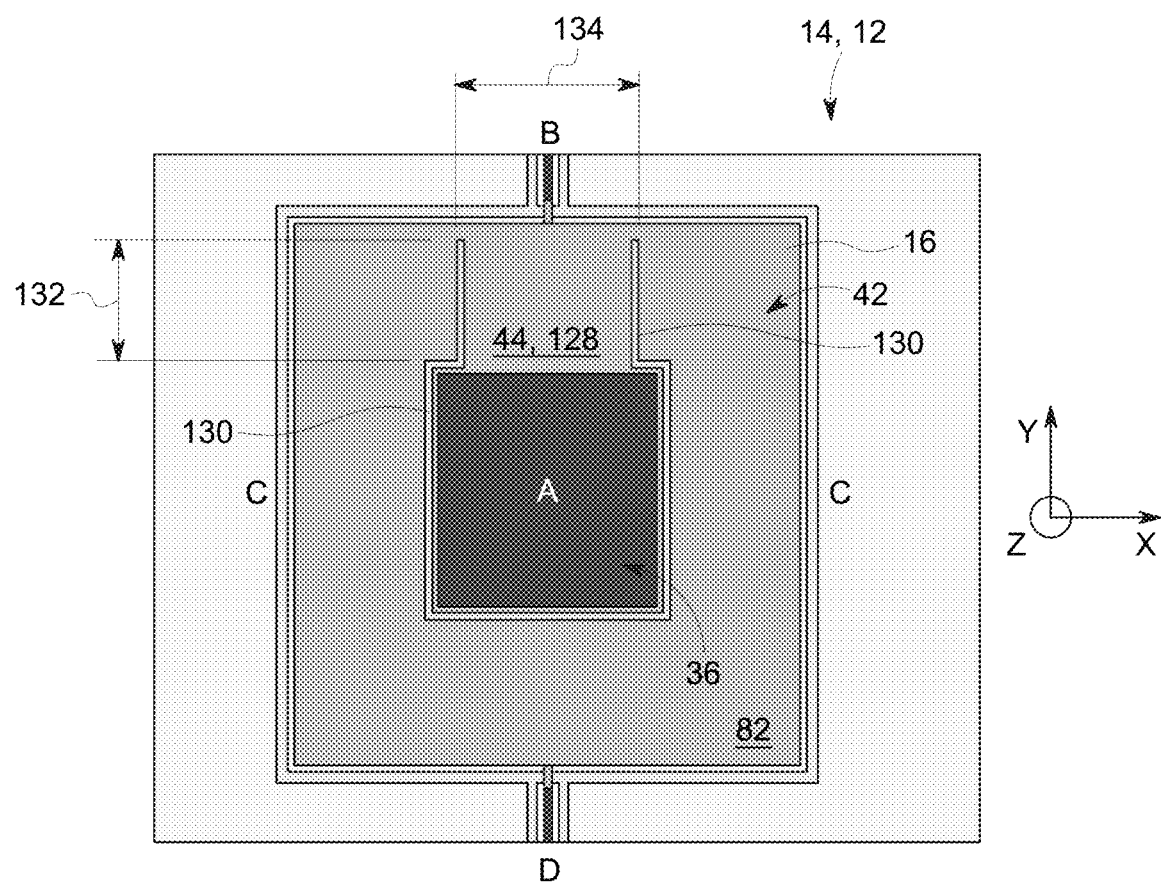
FIG. 9A is a top-down view of a power conversion device having a gate pad with an integrated resistor network that includes an integrated resistor, in accordance with embodiments of the present approach.

More specifically, FIG. 9A illustrates a portion of a gate pad and bus area 14 of an embodiment of a power conversion device 12. The illustrated gate pad and bus area 14 includes a gate pad 16 having a gate metal contact region 36 disposed in a central portion of the gate pad 16. Additionally, the illustrated gate pad 16 is patterned in such way that continuity of the deposited gate material 82 is interrupted (e.g., by etched portions 130) to form the integrated resistor network 42 and the gate metal contact region 36 of the gate pad 16. However, the manner in which the gate pad 16 of FIG. 9A has been etched results in the formation of a single integrated resistor 44 that is disposed between and electrically coupling the gate metal contact region 36 to the remainder of the integrated resistor network 42, while other side or edge of the integrated resistor network 42 is electrically coupled to gate electrodes 34 disposed in areas B, C, and D of the device 12, as indicated. The illustrated integrated resistor 44 of the integrated resistor network 42 includes a single resistor segment 128. Since the disclosed integrated resistor network 42 is constructed from the gate material 82 having a known sheet resistance, it should be noted that the resistance of an integrated resistor 44 may generally be calculated by multiplying the sheet resistance of the gate material 82 by a length 132 of the resistor segment 128 and dividing by the width 134 of the resistor segment 128 of integrated resistor 44.

Figure 9B:
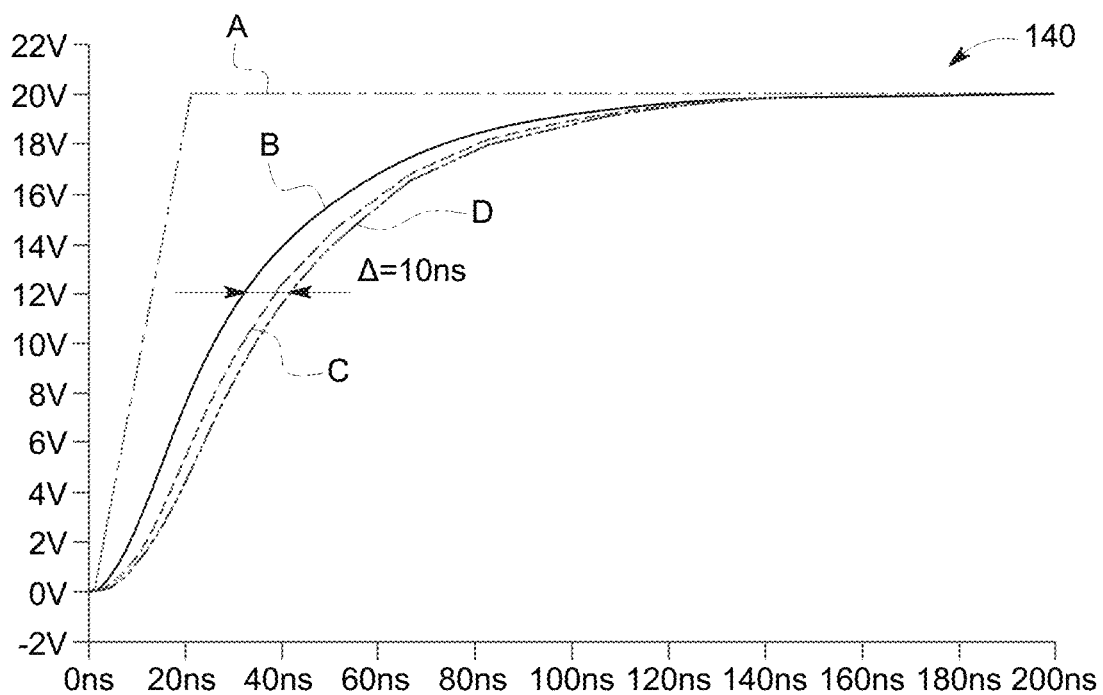
FIG. 9B is a simulated voltage plot illustrating propagation delay within the power conversion device illustrated in FIG. 9A, in accordance with embodiments of the present approach.

FIG. 9B is a plot 140 illustrating simulated voltage curves of transients that occur in gate electrodes 34 located in different areas (i.e., areas B, C, an D) of the device 12 in response to a 0V-20V step (i.e., ramp 20 nanoseconds (ns)) in voltage applied to the gate metal contact region 36 of FIG. 9A. As such, in FIG. 9B, curve A represents the voltage signal applied to the gate metal contact region 36, while curves B, C, and D represent the resulting transients that occur in the gate electrodes 34 located in corresponding areas of the device 12 (e.g., areas B, C, D indicated FIG. 9A). As such, the plot 140 of FIG. 9B indicates a fairly significant difference in delay times (e.g., approximately 10 nanoseconds (ns)) between the voltage transient associated with "fastest" gate electrodes (e.g., in area B) and the voltage transient associated with "slowest" gate electrodes (e.g., in area D) responding to the applied voltage signal, which is generally referred to as propagation delay. It may be appreciated that this propagation delay difference (e.g., discrepancy, nonuniformity) generally results from differences in the respective gate resistance and input capacitance of device cells located in the different areas (e.g., B, C, D) of the device 10. As such, it is presently recognized that, rather than utilize an integrated resistor network 42 having a single integrated resistor 44, as illustrated in FIG. 9A, it is advantageous for present embodiments to allow balance of the turn-on/off of capacitive load (e.g., input capacitance ($C_{iss}$)) associated with the device's layout geometry using an integrated resistor network 42, having multiple resistors 44 with different respective resistance values, integrated into the gate pad 16. This enables the integrated resistor network 42 to provide different resistance values (e.g., a plurality of different respective resistance values) between the gate metal contact region 36 of the gate pad 16 and different gate electrodes 34 located in different areas of the device 12 for such embodiments.

Figure 10A:
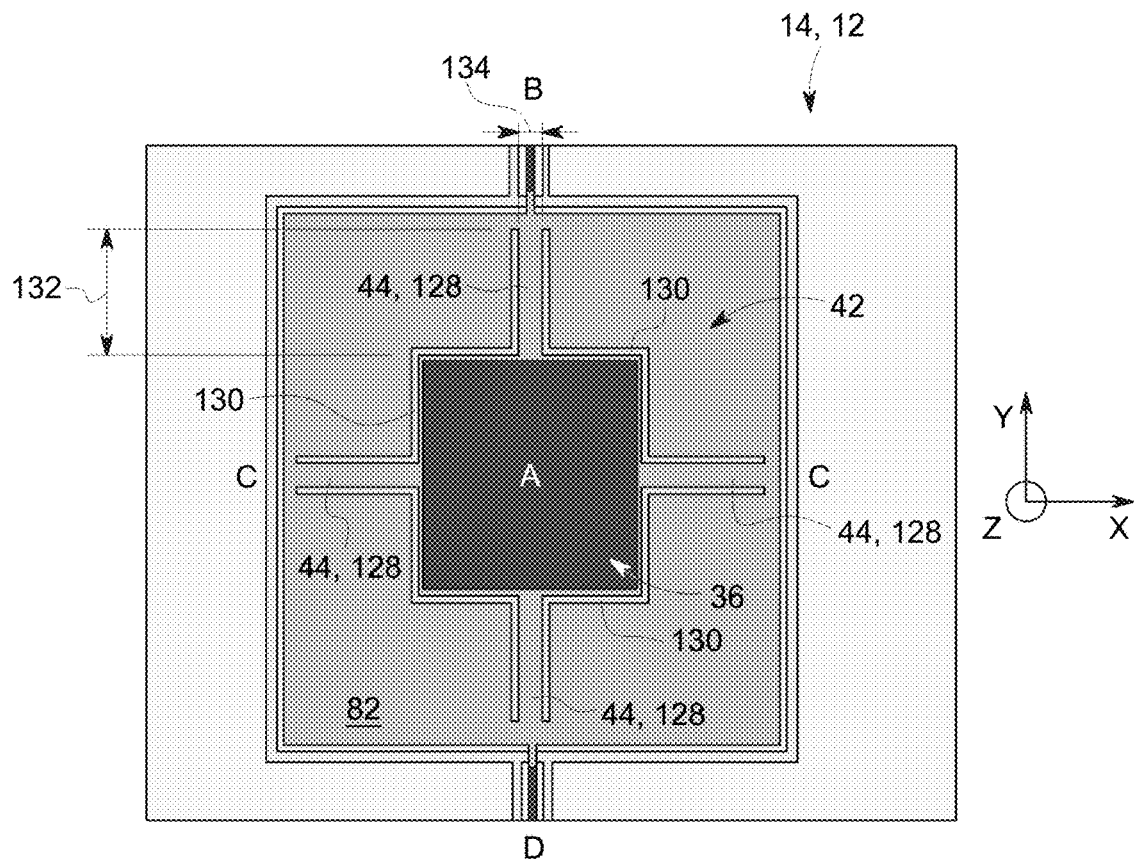
FIG. 10A is a top-down view of a power conversion device including a gate pad having an integrated resistor network that includes four integrated resistors having substantially the same resistance values, in accordance with embodiments of the present approach.
Figure 10B:
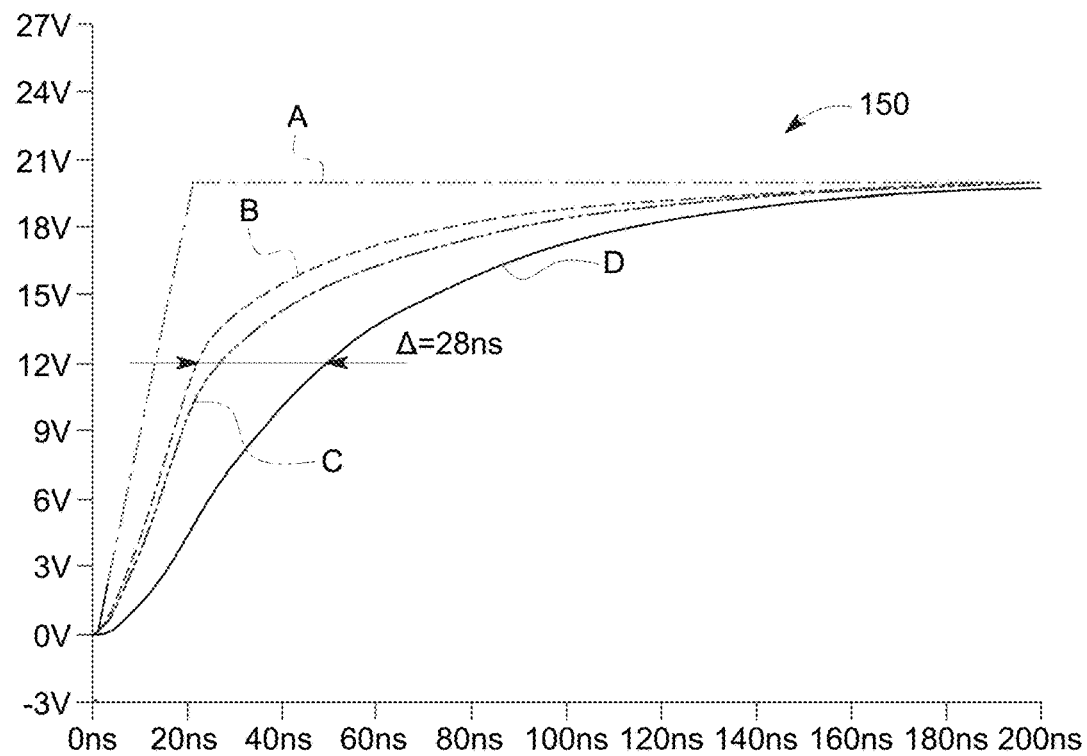
FIG. 10B is a simulated voltage plot illustrating propagation delay within the power conversion device illustrated in FIG. 10A, in accordance with embodiments of the present approach.

To further illustrate this point, FIG. 10A illustrates a portion of a gate pad and bus area 14 for another embodiment of a power conversion device 12. Etched portions 130 in the illustrated gate pad 16 interrupt continuity of the gate material 82 to form the gate metal contact region 36 adjacent to the integrated resistor network 42 of the gate pad 16. The illustrated integrated resistor network 42 includes four integrated resistors 44, each with a single resistor segment 128 having approximately the same length 132 and width 134, and, therefore, approximately the same resistance. FIG. 10B is a plot 150 illustrating simulated transient voltage curves that occur in gate electrodes located in different parts of the device in response to a 0V-20V signal at the gate metal contact region 36 of FIG. 10A. As such, in FIG. 10B, curve A represents the voltage signal applied to the gate metal contact region 36, while curves B, C, and D represent the resulting transients that occur in the gate electrodes 34 located in corresponding areas of the device 10 (i.e., areas B, C, D indicated FIG. 10A).

As such, compared to FIG. 9B, the plot 150 of FIG. 10B indicates even more significant delays (e.g., approximately 28 ns) between voltage transient associated with the "fastest" gate electrodes (e.g., in area B) and the voltage transient associated with "slowest" gate electrodes (e.g., in area D) responding to the voltage signal, compared to FIG. 9B. As mentioned, this propagation delay difference (e.g., discrepancy, nonuniformity) generally results from differences in the respective gate resistance and input capacitance of device cells located in the different areas (e.g., B, C, D) of the device 12. Therefore, it is presently recognized that, in certain embodiments, rather than utilize only an integrated resistor network 42 that provides substantially the same resistance values between the gate metal contact region 36 and the different areas (e.g., areas B, C, D) of the device 12, as presented in FIGS. 10A and 10B, it is beneficial to utilize an integrated resistor network 42, having multiple integrated resistors 44, capable of providing at least two different resistances between the gate metal contact region 36 and the different areas (e.g., areas B, C, D) of the device 12 in the gate pad 16, in order to effectively balance the turn-on/off of capacitive load (e.g., input capacitance ($C_{iss}$)) associated with the layout of the device cells 22 in a power conversion device 12. It is further recognized that operating a power device with significant imbalance in dynamic performance of different device cells will undesirably lead to localized overstress, and, therefore, this imbalance can be mitigated through less efficient operation modes, as presently disclosed.

Figure 11A:
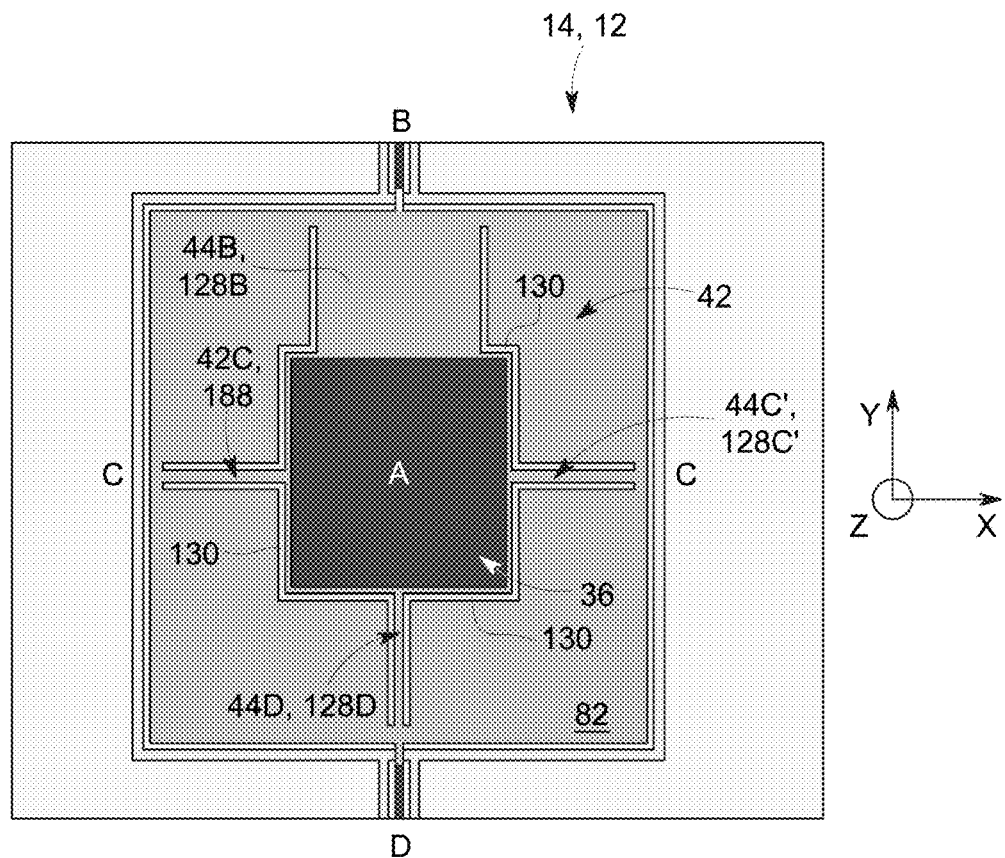
FIG. 11A is a top-down view of a power conversion device having a gate pad with an integrated resistor network having multiple integrated resistors with at least two different respective resistance values, in accordance with embodiments of the present approach.

With the foregoing in mind, FIG. 11A illustrates a portion of a gate pad and bus area 14 of a power conversion device 12 in which the gate pad 16 includes an integrated resistor network 42 (e.g., with integrated resistors 44B, 44C, 44C', and 44D) that provides at least two different respective resistances between a gate metal contact region 36 and the gate electrodes 34 of the device cells 22 disposed in different areas (e.g., areas B, C, and D) of the device 12, in accordance with embodiments of the present technique. Etched portions 130 interrupt continuity of the gate material 82 that forms the gate pad 16, resulting in the formation of the integrated resistor network 42 adjacent to the gate metal contact region 36 in the gate pad 16. The illustrated integrated resistor network 42 includes integrated resistors 44B, 44C, 44C', and 44D that each have a respective resistor segment 128B, 128C, 128C', and 128D having respective width/length ratios and resistances. In particular, integrated resistor 44B (electrically connected between the gate metal contact region 36 and device cells in area B) has a resistor segment 128B with the largest relative width to length ratio (width/length; also referred to as aspect ratio) and, therefore, offers the lowest relative resistance. The integrated resistors 44C and 44C' (electrically connected between the gate metal contact region 36 and device cells in areas C) have resistor segments 128C and 128C' that are substantially the same size as each other, and have smaller width/length ratios than (more resistive than) the resistor segment 128B of the integrated resistor 44B. Integrated resistor 44D (electrically between the gate metal contact region 36 and device cells in area D) has a resistor segment 128D with the smallest relative width/length ratio and, therefore, offers the highest relative resistance. For example, in certain embodiments, the resistance values may be approximately 3.4 ohms for integrated resistor 44B, approximately 60 ohms for integrated resistors 44C and 44C', and approximately 80 ohms for integrated resistor 44D. Since these integrated resistors 44B, 44C, 44C', and 44D of the integrated resistor network 42 are electrically parallel to one another, the net equivalent gate series resistance ($R_{eq}$) of the integrated resistor network 42 is between approximately 3 ohms and approximately 5 ohms. It may be noted that, in certain embodiments, the equivalent gate resistance ($R_{eq}$) of the gate metal contact region 36, gate buses 18, and the gate electrodes 34 of the device cells 22, as illustrated in FIG. 1, is approximately 1 ohm.

Figure 11B:
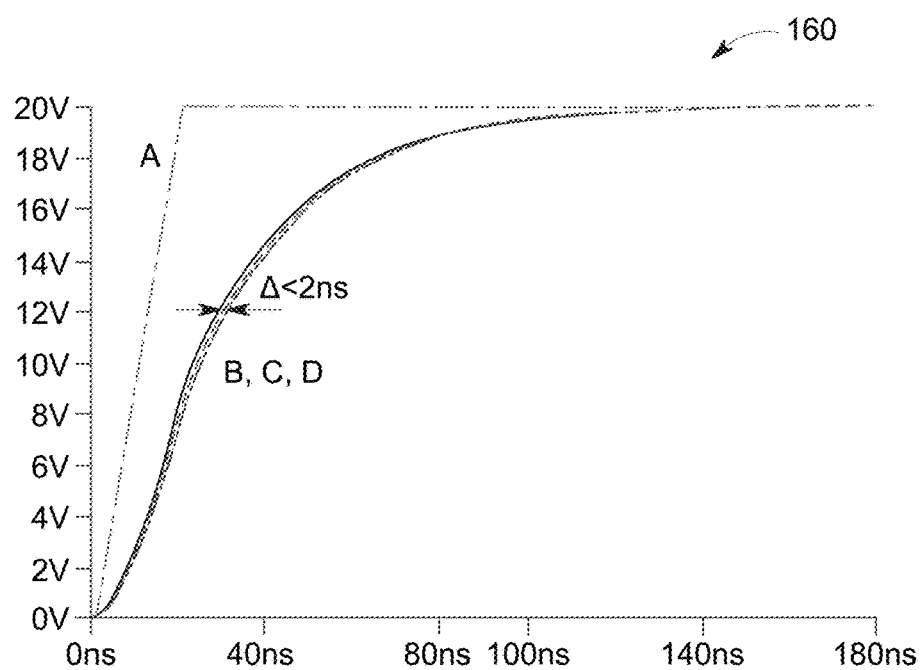
FIG. 11B is a simulated voltage plot illustrating propagation delay within the power conversion device illustrated in FIG. 11A, in accordance with embodiments of the present approach.

FIG. 11B is a plot 160 illustrating simulated transient voltage curves that occur in gate electrodes of device cells located in different parts of the device in response to a 0V-20V signal at the gate metal contact region 36 of FIG. 11A. As such, in FIG. 11B, curve A represents the voltage signal applied to the gate metal contact region 36, while curves B, C, and D represent the resulting voltage transients that occur in the gate electrodes 34 of device cells 22 located in corresponding areas of the device 12 (i.e., areas B, C, D indicated FIG. 11A). As such, the plot 160 of FIG. 10B indicates a substantially smaller difference in propagation delay (e.g., <approximately 2 nanoseconds (ns)) between the "fastest" gate electrodes (e.g., in area B) and the "slowest" gate electrodes (e.g., in area D) responding to the voltage step. Therefore, it is presently recognized that, rather than utilize an integrated resistor network 42 that offers substantially the same resistance value between the gate metal contact region 36 and the gate electrodes of device cells located in different areas (e.g., areas B, C, D), as presented in FIGS. 9 and 10, it is advantageous in present embodiments to utilize an integrated resistor network 42 with unequal resistance paths from gate pad connection region 36 to different regions of the active area (e.g. B, C, D) so as to minimize differences in propagation delay. A simple embodiment accomplishing this is via an integrated resistance network 42 having multiple integrated resistors 44, which enables the integrated resistor network 42 to provide at least two different respective resistance values between the gate metal contact region 36 and the gate electrodes of device cells located in different areas (e.g., areas B, C, D) in order to effectively balance the turn-on/off of capacitive load or input capacitance associated with the layout of the device cells 22 of the power conversion device 12. In certain embodiments, the integrated resistor network 42 may include any suitable number of resistors, and each of the device cells may connect to the particular resistor of the integrated resistor network 42 that is positioned nearest the device cell. For example, in certain embodiments, the integrated resistor network 42 may include a resistor for each of a number of directions (e.g., above, below, to the left, to the right), and device cells located in a particular direction relative to the gate pad 16 may connect to the corresponding resistor of the integrated resistor network 42.

Figure 12:
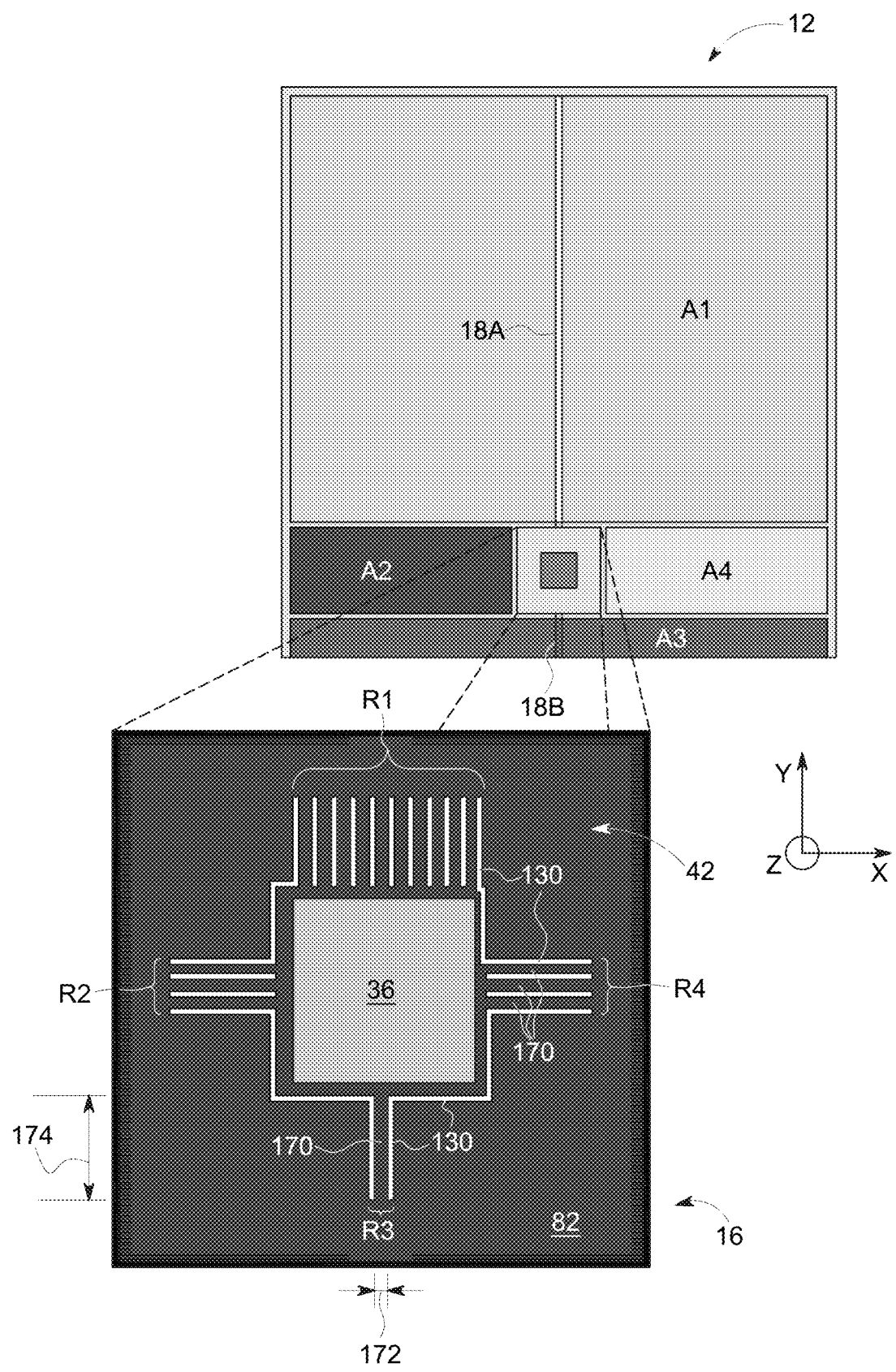
FIG. 12 is a top-down view of a power conversion device having a gate pad with an integrated resistor network that includes multiple integrated resistors having at least two different respective resistance values, wherein the integrated resistors are implemented as a sets of parallel resistor segments, in accordance with embodiments of the present approach.

Additionally, it should be appreciated that the disclosed integrated resistor network 42 can be implemented in different manners in other embodiments. For example, FIG. 12, is a schematic view of a surface of an embodiment of a power conversion device 12 having device cells (not illustrated) disposed in areas A1, A2, A3, and A4. For the illustrated embodiment, the gate electrodes of the device cells of area A1 are electrically coupled to the gate pad 16 via the gate bus 18A, the gate electrodes of the device cells of area A3 are electrically coupled to the gate pad 16 via the gate bus 18B, while areas A2 and A4 are directly electrically coupled to the gate pad 16, as discussed above with respect to FIG. 8B. Further, it may be noted that it may be advantageous from a design prospective to have the gate pad 16 off centered (i.e., not disposed in the middle of the surface of the device 12); however, it may also be noted that an off-centered gate pad 16, as illustrated in FIG. 12, demonstrates greater differences propagation delay without the benefit of the disclosed integrated resistor network 42. As such, it should be appreciated that the disclosed integrated resistor network 42 enables greater freedom in the positioning of the gate pad 16 and gate buses 18 while reducing differences propagation delays for device cells 22 the power conversion device 12.

As illustrated in the enlarged portion of FIG. 12, the gate pad 16 of the illustrated embodiment includes an integrated resistor network 42 with multiple integrated resistors (i.e., integrated resistors R1, R2, R3, and R4), which enable the integrated resistor network 42 to provide three different respective resistance values between the gate metal contact region 36 and the gate electrodes of device cells located in three different areas (e.g., areas A1, A2/A4, A3) of the device 12. More specifically, portions of the gate material 82 used to form the gate pad 16 have been patterned (e.g., etched portions 130) so that each of the integrated resistors R1, R2, R3, and R4 includes or consists at least one resistor segment 170 (e.g., resistive paths 170), and wherein each resistor segment 170 has a minimum width 172 of approximately 1 μm or more. The illustrated integrated resistors R1, R2, and R4 include multiple resistor segments electrically connected in parallel. Similar to the integrated resistors 44 formed from a single resistor segment 170 discussed above, the resistance of an integrated resistor 44 having multiple rectangular resistor segments 170 connected in parallel (e.g., R1, R2, or R4) may generally be calculated by multiplying the sheet resistance of the gate material 82 by a length 174 of the integrated resistor, and then dividing by the total width (i.e., the sum of each minimum width 172) of the parallel resistor segments 170 of the integrated resistor. As such, when the lengths and widths of each segment 170 are substantially the same for the gate pad 16 illustrated in FIG. 12, R1 (having the greatest number of resistive segments 170) demonstrates the lowest resistance, the resistance of R2 and R4 (having the second greatest number of resistive segments 170) are approximately equal and greater than the resistance of R1, and R3 (having the smallest number of resistive segments 170) demonstrates the highest relative resistance.

For the gate pad 16 illustrated in FIG. 12, the relative length/width ratios and resistance values of integrated resistors R1, R2, R3, R4 are generally scaled based on the size of the portions of active area to which they are electrically connected, in order to minimize differences in turn-on or turn-off transients resulting from different resistor-capacitor (RC) time constants associated with different portions of device active area. For example, in one embodiment, the respective resistance values of the integrated resistors of an integrated resistor network (e.g., R1, R2, etc.) may be configured such that the product of the resistance of a particular integrated resistor (e.g., in ohms) and the size of the active area (e.g., in square micrometers) having gate electrodes electrically connected to the particular integrated resistor is substantially similar (e.g., within 10%, 5%, or 1% of one another). That is, in certain embodiments, the resistance value of R1 multiplied by the area A1 is approximately the same as the resistance value of R2 multiplied by the area A2, which is approximately the same as the resistance value of R3 multiplied by the area A3 and approximately the same as the resistance value of R4 multiplied by the area A4. Additionally, in certain embodiments, the equivalent combination of the integrated gate resistors (e.g., R1, R2, R3, R4, and the spreading resistance of the electrode material 82 connecting them together) are larger than that of the parasitic equivalent series resistance of the remainder of the power conversion device 12. Additionally, in certain embodiments, the resistance values (and thus the width/length ratios) of each integrated resistor (e.g., R1, R2, R3, R4, IL) are chosen/defined in a such way that the overall equivalent resistance of the integrated resistor network ($R_{eq}$) is similar to (e.g., greater than about 0.5× of) the desired total device gate resistance value $R_g$ ($R_{eq}$=3-5 ohms in the example shown in FIG. 12), while minimizing the difference in the propagation delay associated with different gate resistance and input capacitance of the different areas of the device 12 (e.g., areas A1, A2, A3, and A4). For example, the portion of device 12 having gate electrodes 34 that are electrically connected to the gate pad 16 via the gate bus 18A (e.g., in area A1) have a greater associated input capacitance than gate electrodes 34 that are directly electrically connected to the gate pad 16 (e.g., in areas A2 and A4), and therefore, the resistances of R2 and R4 are greater than the resistance of R1 to compensate for this difference in input capacitances and to substantially reduce the difference in propagation delay between device cells 22 in different areas of the power conversion device 12.

Figure 13:
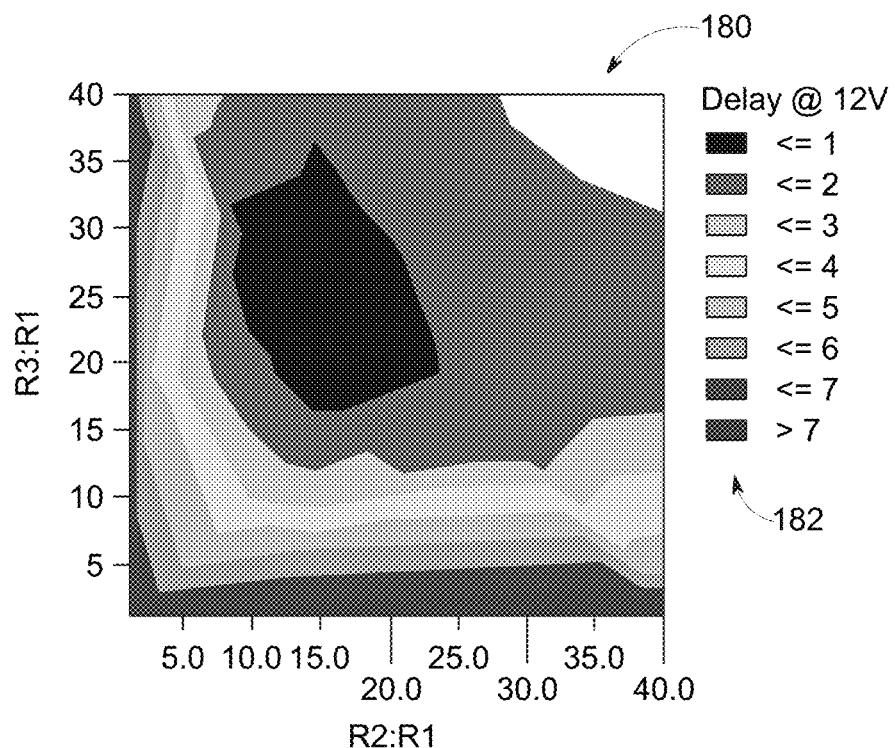
FIG. 13 is a plot illustrating the simulated difference in voltage propagation delay as a function of the ratios of the resistances of the integrated resistors of the integrated resistor network of the power conversion device of FIG. 12, in accordance with embodiments of the present approach.

FIG. 13 is a plot 180 that illustrates the difference in propagation delays of a gate signal (in ns) that result from the integrated resistors of the integrated resistor network 42 having different ratios of resistance values for embodiments of the power conversion device 12 illustrated in FIG. 12. In the plot 180, the horizontal axis represents the ratio of the resistance values of R3 and R1, while the vertical axis represents the ratio of the resistance values of R2 (or R4) and R1. As indicated by the key 182, the smallest difference in propagation delays (e.g., less than or equal to 1 ns) are demonstrated when the ratio of the resistance of R2 (or R4) to the resistance of R1 is between approximately 10 and approximately 25, and the ratio of the resistance of R3 to the resistance of R1 is between approximately 15 and approximately 35.

For example, in certain embodiments, for the power conversion device 12 illustrated in FIG. 12, the resistance of R1 may be greater than approximately $R_g/2$ and less than $R_g$, wherein $R_g$ is the total equivalent series resistance of the transistor gate. For example, in certain embodiments, $R_g$ is between approximately 1 ohm and approximately 80 ohms (e.g., between approximately 3 ohms and approximately 20 ohms). Additionally, in certain embodiments, the ratio of the resistance of R2 to the resistance of R1, the ratio of the resistance of R4 to the resistance of R1, and the ratio of the resistance of R3 to the resistance of R1 are all greater than approximately 5:1. More specifically, in certain embodiments, the ratio of the resistance of R2 (or R4) to the resistance of R1 is between approximately 7.5:1 and approximately 25:1, the ratio of the resistance of R3 to the resistance of R1 is between approximately 10:1 and approximately 35:1, the ratio of the resistance of R2 (or R4) to the resistance of R3 is between approximately 1:1 and approximately 2:1. In certain embodiments, the ratio of the resistance of R3 to the resistance of R2 (or R4) to the resistance of R1 is approximately 20:15:1. For example, in certain embodiments, R1 may range from approximately 2 ohms to approximately 10 ohms, R2 (and R4) may range from approximately 30 ohms to 150 ohms, and R3 may range from approximately 80 ohms and approximately 400 ohms. It may be noted that, in certain embodiments, device cells are not located in the area A3, and therefore, R3 may not be present. Additionally, it may be appreciated that the resistance values of R2 and R4 may be substantially the same when the gate pad 16 is positioned near the center of the power conversion device 12; however, for embodiments in which the gate pad 16 is off-center (e.g., to the left or right, as illustrated), then the resistance values of R2 and R4 may also be different.

Figure 14:
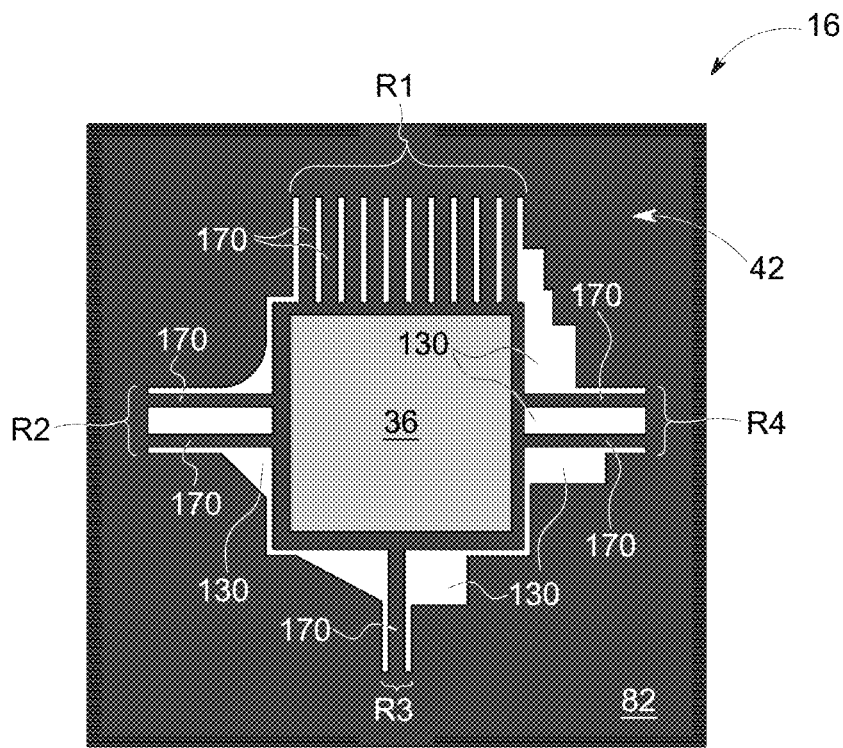
FIG. 14 a top-down view of a power conversion device having a gate pad with an integrated resistor network that includes multiple integrated resistors include etched portions having varying widths and/or shapes, in accordance with embodiments of the present approach.

FIG. 14 illustrates an embodiment of a gate pad 16 with an integrated resistor network 42 including a number of integrated resistors R1, R2, R3, and R4. As illustrated in FIG. 14, the gate material 82 has been removed in etched regions 130, which have different sizes and shapes and define at least one resistor segment 170 of each integrated resistor. As such, FIG. 14 illustrates that the gate material 82 of the gate pad 16 may be shaped in a variety ways (e.g., to form parallel etched regions, variable width etched regions, and/or irregular etched regions 130) to yield an integrated resistor network 42, each having one or more resistor segments 170 with a variety of shapes, sizes, and/or spacing that are separated by etched regions 130 with a variety of shapes and/sizes to provide the desired resistance value.

Further, it is presently recognized that the resistor segments 170 may have different shapes (e.g., parallel segments, segments that increase or decrease in width with increasing distance from the gate metal contact region 36, and/or irregular shapes), and that dimensional control of the total length and total width of all of the resistor segments 170 of the integrated resistors R1, R2, R3, and R4 enables resistance tuning for the integrated resistors 44 and the integrated resistor network 42. As such, the disclosed integrated resistors networks 42 of the present approach may take on a variety of shapes and sizes to enable suitable device performance, in accordance with the present disclosure. For example, while the illustrated resistive segments 170 are rectangular, these are merely provided as examples, and other shapes (e.g., triangular, hexagonal, trapezoidal) of restive segments 170 may also be used. Additionally, beyond shaping the resistors R1-R4, it may be noted that the size and shape of the etched regions 130 also influence the resistance between the gate metal contact region 36 and the gate electrodes 34 of device cells disposed in different areas of the device 12. That is, since the remainder of the integrated resistor network 42 (e.g., the portion of the gate pad 16 outside of the gate metal contact region 36 and the plurality of integrated resistors 44) affects the resistance value provided between the gate metal contact region 36 and the gate electrodes 34 of the MOSFET cells 22, this portion of the integrated resistor network 42 may be further patterned and etched to tune the resistance value provided by different portions of the integrated resistor network 42. Additionally, it may be appreciated that, in certain embodiments, the different areas of the device 12 (e.g., A1, A2, A3, A4 of FIG. 12) may be further divided into smaller areas. For such embodiments, the complexity of the integrated resistor network 42 may increase by incorporating additional integrated resistors 44 into the integrated resistor network 42 (e.g., R5, R6, R7, R8, $R_n$) adjacent to the gate metal contact region 36 and/or by forming additional etched regions 130 that shape electrical pathways between certain integrated resistors (e.g., R1, R2, R3, etc.) and certain portions of the edges of the gate pad 16 to mitigate differences in propagation delay between different device cells 22 at an increasingly granular level (e.g., down to individual cells). For example, in certain embodiments, more sophisticated estimates of total/equivalent gate resistance can be obtained through real layout network analysis performed utilizing computer-aided design (CAD) tools, which can be used to design complex integrated resistor networks 42 that minimize differences propagation delay in the gate electrodes 34 of the MOSFET cells 22, regardless of their position in the device 12.

Figure 15:
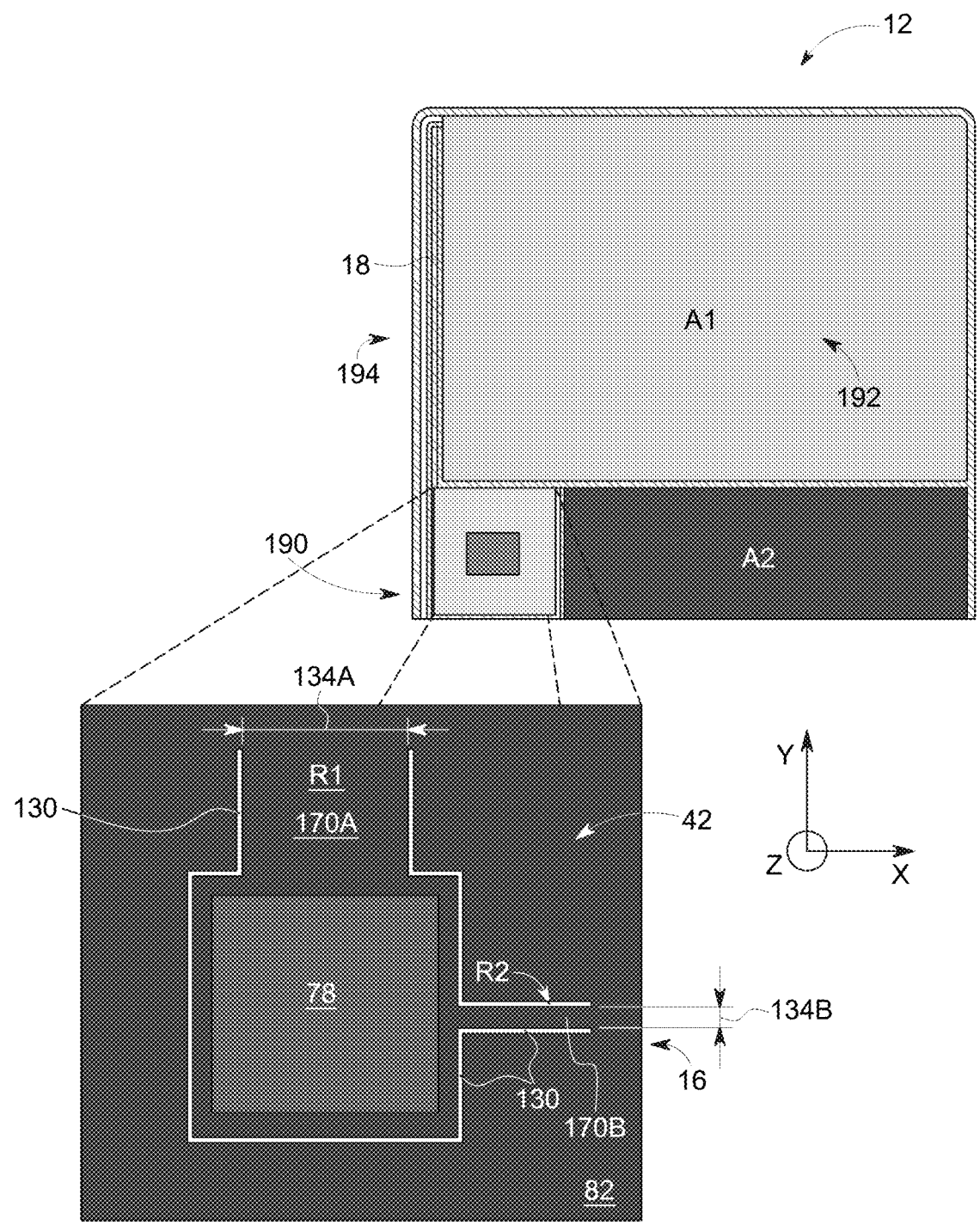
FIG. 15 is a top-down view of a power conversion device having a gate pad disposed near a corner of the device, wherein the gate pad has an integrated resistor network including two integrated resistors having two different respective resistance values, in accordance with embodiments of the present approach.

FIG. 15 illustrates a top-down view of a power conversion device 12 having device cells (not illustrated) disposed in areas A1 and A2, and having a gate pad 16 disposed near a corner 190 (e.g., away from a central portion 192 and near one or more edge portions 194) of the power conversion device 12. For the illustrated embodiment, the gate electrodes 34 of the device cells 22 of area A1 are electrically coupled to the gate pad 16 via the gate bus 18, which extends along the edge 194 of the power conversion device 12. Additionally, the gate electrodes 34 of the device cells 22 in area A2 are directly electrically coupled to the gate pad 16, as discussed above with respect to FIG. 8B.

Figure 16:
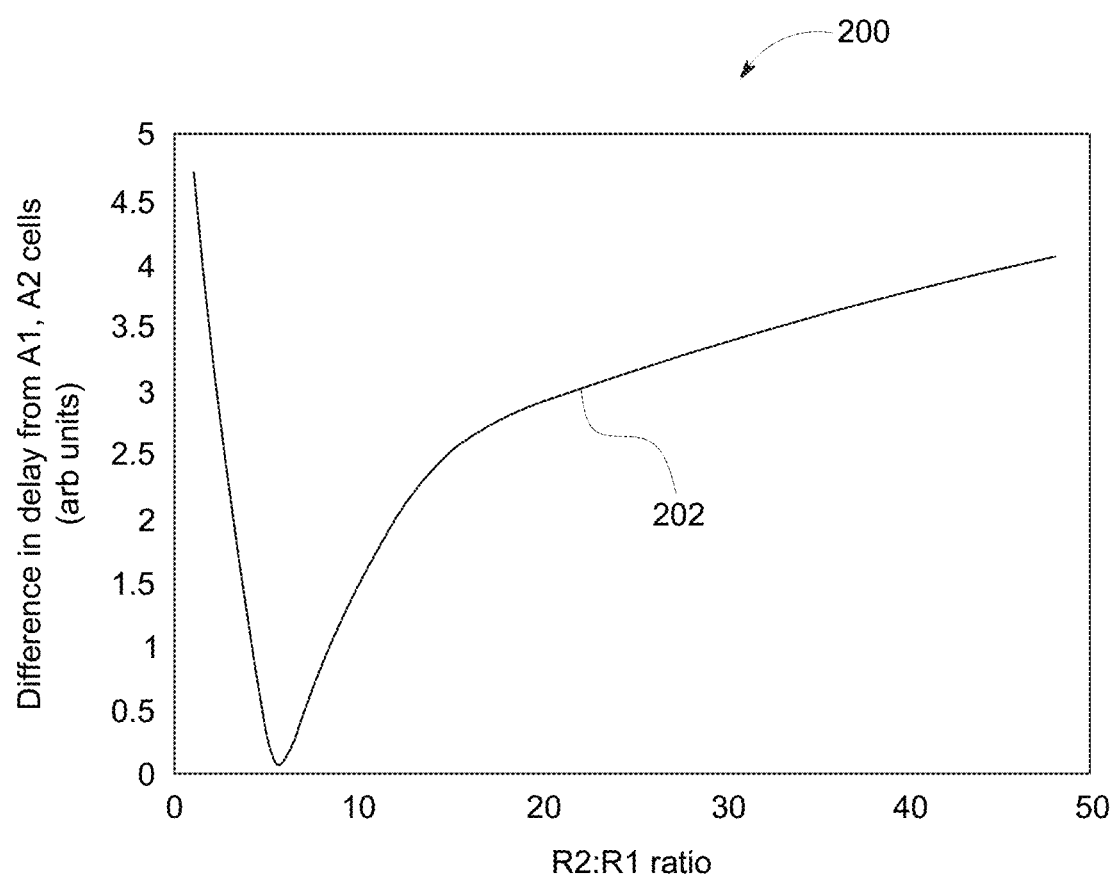
FIG. 16 is a plot illustrating a difference in propagation delay as a function of the ratios of the resistances of the integrated resistors of the integrated resistor network in the gate pad of the power conversion device of FIG. 15, in accordance with embodiments of the present approach.

As illustrated in the enlarged portion of FIG. 15, the gate pad 16 of the illustrated embodiment includes an integrated resistor network 42 having multiple integrated resistors (i.e., R1 and R2) with different respective resistance values, such that the integrated resistor network 42 provides a first resistance value between the gate metal contact region 36 and gate electrodes 34 of device cells 22 located in area A1, and has a second (different) resistance value between the gate metal contact region 38 and gate electrodes 34 of device cells 22 located in area A2. More specifically, portions of the gate material 82 have been etched (e.g., etched portions 130) so that the integrated resistors R1 and R2 of the integrated resistor network 42 each includes or consists of at least one resistor segment 170A and 170B, respectively. Additionally, the integrated resistors R1 and R2 each include a respective resistor segment 170A and 170B having a respective minimum width 134A and 134B of approximately 1 µm or more. As illustrated in FIGS. 12 and 14, in certain embodiments, the integrated resistors R1 and R2 of the gate pad 16 illustrated in FIG. 15 may be alternatively implemented using multiple parallel resistor segments 170, as illustrated in FIGS. 12 and 14, each having a minimum width 172 of at least 1 µm. FIG. 16 is a plot 200 illustrating a difference in propagation delay between device cells 22 located in area A1 and A2 (in arbitrary units) relative to the ratio of the resistance of R2 and R1 for the embodiment of the device 12 illustrated in FIG. 15. For the illustrated embodiment, the minimum difference in propagation delay occurs when the ratio of the resistance of R2 to R1 is between approximately 3 and approximately 7 (e.g., between approximately 4 and 6, or approximately 5), as indicated by the curve 202.

For the embodiment of the gate pad 16 illustrated in FIG. 15, the ratios of the resistance values of integrated resistors R1 and R2 may be generally scaled based on the size of portion of the active area 20 to which they are electrically connected (e.g., gate area, area of semiconductor surface covered by gate electrodes 34 in a region of the active area of the device 12). In general, the multiplication product of the resistance of a particular integrated resistor (e.g., in ohms) and the size of the active area (e.g., in square micrometers) having gate electrodes 34 electrically connected to the particular integrated resistor is approximately the same (e.g., within 10%, 5%, or 1%). That is, the resistance value of R1 multiplied by the area A1 is approximately the same as the resistance value of R2 multiplied by the area A2. Additionally, for the power conversion device 12 illustrated in FIG. 15, $R_g$ may be between approximately 3 ohms and approximately 20 ohms.

For embodiments of the gate pad 16 illustrated in FIG. 15, the ratio of the resistance of R2 to the resistance of R1 is greater than approximately 1:1 and less than approximately 15:1. More specifically, in certain embodiments, the ratio of the resistance of R2 to R1 is between approximately 4:1 and approximately 10:1. In certain embodiments, the width 134B of R2 (i.e., the sum of the widths of all of the one or more resistor segments 170 of the integrated resistor R2) should be between approximately 0.1× to approximately 0.25× the width 134A of R1 (i.e., the sum of the widths of all of the one or more resistor segments 170 of the integrated resistor R1). For example, in certain embodiments, the total width of R1 may be between approximately 50 μm and approximately 500 μm, and the total width of R2 may be between approximately 5 μm and approximately 125 μm. It may be appreciated that the resistance values of R1 and R2, and the ratios thereof, may be reversed when the gate pad 16 is positioned in a different corner of the power conversion device 12.

Figure 17:
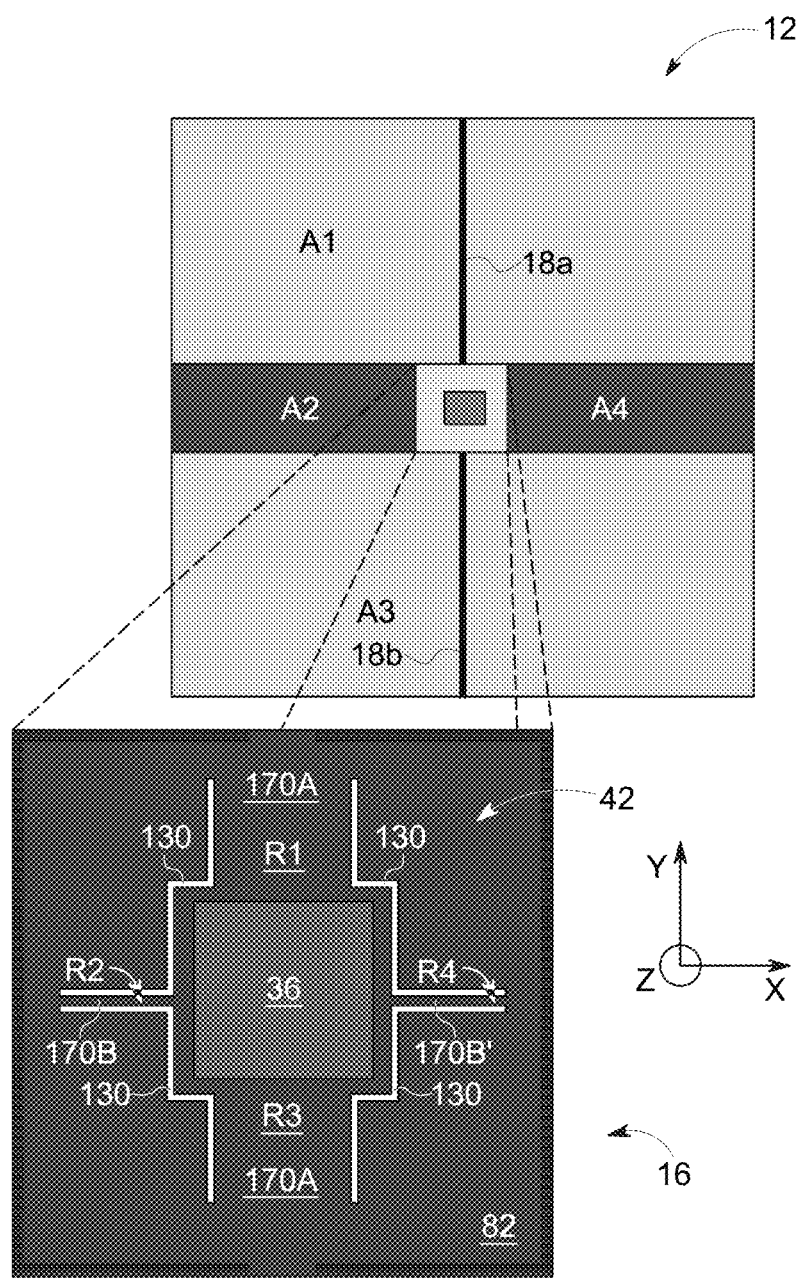
FIG. 17 is a top-down view of a power conversion device having a gate pad disposed near a center or middle of the device, wherein the gate pad has an integrated resistor network including four integrated resistors having two different respective resistance values, in accordance with embodiments of the present approach.

FIG. 17 is a top-down view of a surface of an embodiment of a power conversion device 12 having device cells (not illustrated) disposed substantially evenly in areas A1, A2, A3, and A4 around a substantially centrally located gate pad 16. For the illustrated embodiment, the gate electrodes 34 of the device cells 22 of area A1 are electrically coupled to the gate pad 16 via the gate bus 18A, the gate electrodes 34 of the device cells 22 of area A3 are electrically coupled to the gate pad 16 via the gate bus 18B, while gate electrodes 34 of device cells 22 in areas A2 and A4 are directly electrically coupled to the gate pad 16, as discussed above. It may be appreciated that, for embodiments in which the gate pad 16 is centrally located such that the number of device cells in areas A1 and A3 (i.e., coupled to the gate metal contact region 36 via the gate buses 18) are substantially similar and such that the number of device cells in areas A2 and A4 are substantially similar, the number of device cells in areas A1 and A3 may still be substantially greater than (e.g., between approximately 10× and approximately 100×) the number of device cells 22 in areas A2 and A4.

As illustrated in the enlarged portion of FIG. 17, the gate pad 16 of the illustrated embodiment includes an integrated resistor network 42 having multiple integrated resistors (e.g., R1, R2, R3, and R4), which enables the gate pad 16 to provide different respective resistance values between the gate metal contact region 36 and the gate electrodes 34 of device cells 22 located in different areas of the device 12. For example, for the illustrated embodiment, R1 and R3 have substantially similar resistance value, R2 and R4 have substantially similar resistance values. In certain embodiments, the resistance of R1 (or R3) may be greater than approximately 2×$R_g$, wherein $R_g$ is between approximately 1 ohm and approximately 80 ohms (e.g., between approximately 3 ohms and approximately 20 ohms). As discussed above, portions of the gate material 82 have been removed (e.g., etched portion 130) to form the gate metal contact region 36 and the integrated resistor network 42 of the gate pad 16. Each of the integrated resistors R1, R2, R3, and R4 of the integrated resistor network 42 include or consist of at least one resistor segment 170 (e.g., resistor segments 170A and 170A', resistor segments 170B and 170B'), wherein each resistor segment has a minimum width of approximately 1 μm or more. For the illustrated embodiment, the ratio of the resistance of R2 (or R4) to the resistance of R1 (or R3) is between approximately 2:1 and approximately 10:1 (e.g., between approximately 4:1 and approximately 8:1).

Technical effects of the present disclosure include the fabrication of a semiconductor power conversion device (e.g., SiC power conversion device) having gate pads that include an integrated resistor network that mitigates against (e.g., minimizes) differences in propagation delay for device cells located in different areas of the device. The disclosed integrated resistor network provides at least two difference resistance value between a gate metal contact region and gate electrodes of device cells located in different areas of the power device. The disclosed integrated resistor network ensures that device cells operate in a synchronized manner (e.g., minimal differences in propagation delay), regardless of their location relative to the gate pad, while avoiding the increase of cost, complexity, and size of external chip resistors. The disclosed gate pad, including the integrated resistor network, may be formed during the same deposition and lithography step used to form the gate electrodes and gate buses, and, therefore, does not require extra processing steps to implement. The disclosed integrated resistor network enables the design and fabrication of a unique asymmetric gate pad structure that counterbalances internal asymmetry of dynamic characteristics (e.g. asymmetric input capacitance) in the power conversion device to provide uniform current/voltage distribution in all device cells during switching events.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A semiconductor power conversion device, comprising:
   an active area, comprising:
      a plurality of device cells disposed in different portions of the active area, wherein each of the plurality of device cells includes a respective gate electrode; and
   a gate pad and bus area, comprising:
      a gate pad including a gate metal contact region disposed adjacent to an integrated resistor network having plurality of integrated resistors;
      a first gate bus extending between the gate pad and a first portion of the plurality of gate electrodes in a first portion of the active area of the device; and
      a gate pad metal disposed directly over the gate metal contact region of the gate pad and bonded to an external gate connection, wherein the first portion of the plurality of gate electrodes has a first gate resistance and a first input capacitance and is electrically connected to the external gate connection via a first integrated resistor of the plurality of integrated resistors, the first gate bus, the gate metal contact region, and the gate pad metal, and wherein a second portion of the plurality of gate electrodes in a second portion of the active area of the device has a second gate resistance and a second input capacitance and is electrically connected to the external gate connection via a second integrated resistor of the plurality of integrated resistors, the gate metal contact region, and the gate pad metal, and wherein the first and second integrated resistors have substantially different respective resistance values to account for differences between the first gate resistance and the second gate resistance and between the first input capacitance and the second input capacitance to synchronize switching of the plurality of device cells.

2. The device of claim 1, wherein the gate pad and bus area comprises a second gate bus and a third portion of the plurality of gate electrodes are electrically connected to the external gate connection via a third integrated resistor of the plurality of integrated resistors and the second gate bus.

3. The device of claim 1, wherein the respective resistance of each of the plurality of integrated resistors in the integrated resistor network is different.

4. The device of claim 1, wherein at least two of the respective resistances of the plurality of integrated resistors included in the integrated resistor network are the same.

5. The device of claim 1, wherein each of the plurality of integrated resistors comprises at least one respective resistor segment having a minimum width of 1 micrometer (µm) or more.

6. The device of claim 5, wherein at least one of the plurality of integrated resistors comprises a plurality of respective resistor segments having a minimum width of 1 micrometer (µm) or more.

7. The device of claim 1, wherein a multiplication product of the respective resistance of the first integrated resistor and the first area is approximately equal to a multiplication product of the respective resistance of the second integrated resistor and the second area.

8. The device of claim 1, wherein a total gate equivalent series resistance ($R_g$) of the semiconductor power conversion device is between approximately 1 ohms and approximately 80 ohms.

9. The device of claim 8, wherein the $R_g$ of the semiconductor power conversion device is between approximately 3 ohms and approximately 20 ohms.

10. The device of claim 1, wherein a ratio of the respective resistance of the second integrated resistor to the respective resistance of the first integrated resistor is greater than approximately 1:1 and less than approximately 15:1.

11. The device of claim 1, wherein a sheet resistance of the gate resistor layer is between 2 ohms per square (ohm/square) and 50 ohm/square.

12. The device of claim 11, wherein the sheet resistance of the gate resistor layer is the substantially the same as a sheet resistance of each respective gate electrode of the plurality of device cells in the active cell area of the device.

13. The device of claim 1, wherein the plurality of integrated resistors of the integrated resistor network comprises a third integrated resistor electrically connected to a third plurality of gate electrodes corresponding to a third area of the semiconductor device, wherein a multiplication product of the respective resistance of the third integrated resistor and the third area is approximately equal to the multiplication product of the respective resistance of the first integrated resistor and the first area, and also approximately equal to the multiplication product of the respective resistance of the second integrated resistor and the second area.

14. The device of claim 13, wherein a ratio of the respective resistance of the third integrated resistor to the respective resistance of the second integrated resistor to the respective resistance of the first integrated resistor is approximately 20:15:1.

15. The device of claim 13, wherein a ratio of the respective resistance of the second integrated resistor to the respective resistance of the first integrated resistor, as well as a ratio of the respective resistance of the third integrated resistor and the respective resistance of the first integrated resistor, is between approximately 7.5:1 and 25:1.

16. The device of claim 13, wherein the plurality of integrated resistors of the integrated resistor network comprise a fourth integrated resistor electrically coupled to a fourth plurality of gate electrodes corresponding to a fourth area of the semiconductor device, wherein a multiplication product of the respective resistance of the fourth integrated resistor and the fourth area is approximately equal to the multiplication product of the respective resistance of the first integrated resistor and the first area.

17. The device of claim 16, wherein each of the ratios of the respective resistances of the second, third, and fourth integrated resistor to the respective resistance of the first integrated resistor are greater than approximately 5:1.

18. The device of claim 16, wherein the respective resistance of the first integrated resistor is less than a total gate equivalent series resistance ($R_g$) of the semiconductor power conversion device and greater than $R_g/2$.

19. The device of claim 16, wherein the respective resistance of the first integrated resistor is between about 2 ohms and about 10 ohms, the respective resistance of the second integrated resistor is between about 30 ohms and about 150 ohms, the respective resistance of the third integrated resistor is between about 30 ohms and about 150 ohms, and the respective resistance of the fourth integrated resistor is between about 80 ohms and about 400 ohms.

20. The device of claim 16, wherein the first area is approximately equal to the third area, the respective resistance of the first integrated resistor is approximately equal to the respective resistance of the third integrated resistor, the second area is approximately equal to the fourth area, and the respective resistance of the second integrated resistor is approximately equal to the respective resistance of the fourth integrated resistor, and wherein a ratio of the respective resistance of the second integrated sensor and the respective resistance of the first integrated resistor is between approximately 2:1 and 10:1.

21. The device of claim 16, wherein a ratio of the respective resistance of the second integrated resistor and the respective resistance of the first integrated resistor is between approximately 4:1 and 8:1.

22. The device of claim 16, wherein the respective resistance of the first integrated resistor is greater than one half a total gate equivalent series resistance ($R_g$), of the semiconductor power device.

23. The device of claim 1, wherein the semiconductor power conversion device is a silicon carbide (SiC) power conversion device and the plurality of device cells is a plurality of MOSFET device cells.

24. The device of claim 1, wherein a sum of the respective resistor value of the first integrated resistor a corresponding first portion of a total gate equivalent series resistance ($R_g$)

is approximately equal to a sum of the respective resistor value of the second integrated resistor a corresponding second portion of the $R_g$.

25. A method, comprising:
forming a plurality of gate electrodes of a plurality of device cells in an active area of a semiconductor power conversion device while forming a gate pad in a gate pad and bus area of the semiconductor power conversion device, wherein a first portion of the plurality of gate electrodes has a first gate resistance and a first input capacitance and a second portion of the plurality of gate electrodes has a second gate resistance and a second input capacitance, wherein the gate pad comprises a gate metal contact region disposed adjacent to an integrated resistor network, wherein a first portion of the integrated resistor network includes a first integrated resistor and provides a first resistance between the gate metal contact region and a first portion of the plurality of gate electrodes, and wherein a second portion of the integrated resistor network includes a second integrated resistor and provides a second resistance between the gate metal contact region and a second portion of the plurality of gate electrodes, and wherein the first and second resistances are substantially different to account for differences between the first gate resistance and the second gate resistance and between the first input capacitance and the second input capacitance to synchronize switching of the plurality of device cells.

26. The method of claim 25, wherein forming the gate pad comprises:
depositing a low-impedance gate material layer over a gate pad region in the gate pad and bus area of the semiconductor power conversion device, wherein the low-resistance gate material layer has a sheet resistance of between approximately 3 ohms per square (ohm/square) and approximately 6 ohm/square at 25° C., and wherein the low-resistance gate material layer forms the gate metal contact area of the gate pad; and
selectively etching portions of the low-resistance gate material layer to form one or more resistor segments of each the first and second integrated resistors of the integrated resistor network.

27. The method of claim 25, comprising fabricating the active area of a semiconductor power conversion device of a semiconductor power conversion device before forming the plurality of gate electrodes, comprising implanting a body/source contact region, a channel region, and a source region adjacent to a surface of the semiconductor power conversion device for each of the plurality of striped device cells.

28. The method of claim 25, comprising:
forming a gate dielectric at a surface of the semiconductor power conversion device, in the active area, before forming the plurality of gate electrodes;
forming a field oxide layer at the surface of the semiconductor power conversion device, in the gate pad and bus area, before forming the gate pad;
forming an interlayer dielectric (ILD) over the surface of the semiconductor power conversion device directly over the plurality of gate electrodes in the active area and directly over the integrated resistors of the gate pad in the gate pad and bus area of the semiconductor power conversion device;
selectively removing portions of the gate dielectric, the ILD, or both, disposed at the surface of the semiconductor power conversion device to form a gate via and bus via in the gate pad and bus area and to expose body/source contact regions of the plurality of device cells at the surface of the semiconductor power conversion device in the active area; and
depositing source metal directly over the body/source contact regions of the plurality of device cells in the active area of the semiconductor power conversion device, as well as depositing gate pad metal into the gate via of the gate pad and depositing gate bus metal into the bus via in the gate pad and bus area of the semiconductor power conversion device.

29. A semiconductor power conversion device, comprising:
an active area, comprising:
a plurality of device cells disposed in different portions of the active area, wherein each of the plurality of device cells includes a respective gate electrode; and
a gate pad and bus area, comprising:
a gate pad including a gate metal contact region disposed adjacent to an integrated resistor network; and
a first gate bus extending between the gate pad and a first portion of the plurality of gate electrodes in a first portion of the active area of the device, wherein the first portion of the plurality of gate electrodes has a first gate resistance and a first input capacitance and is electrically connected to the gate metal contact region via a first portion of the integrated resistor network and the first gate bus, and wherein a second portion of the plurality of gate electrodes in a second portion of the active area of the device has a second gate resistance and a second input capacitance and is electrically connected to the gate metal contact region via a second portion of the integrated resistor network, and wherein a resistance value of the first portion of the integrated resistor network is substantially different from a resistance value of the second portion of the integrated resistor network to account for differences between the first gate resistance and the second gate resistance and between the first input capacitance and the second input capacitance to synchronize switching of the plurality of device cells during operation.

* * * * *